United States Patent [19]
Motoda et al.

[11] Patent Number: 6,058,544
[45] Date of Patent: May 9, 2000

[54] SCRUBBING APPARATUS AND SCRUBBING METHOD

[75] Inventors: Kimio Motoda, Kumamoto; Yoshiharu Ota; Norio Uchihira, both of Kumamoto-ken; Kiyohisa Tateyama, Kumamoto, all of Japan

[73] Assignee: Tokyo Electron Limited, Japan

[21] Appl. No.: 09/025,344

[22] Filed: Feb. 18, 1998

[30] Foreign Application Priority Data

Feb. 19, 1997 [JP] Japan .................................. 9-035104

[51] Int. Cl.$^7$ .................................. B08B 3/04; B08B 3/10
[52] U.S. Cl. .................................................. 15/77; 15/102
[58] Field of Search .............................. 15/77, 88.3, 88.4, 15/102

[56] References Cited

U.S. PATENT DOCUMENTS

| | | | |
|---|---|---|---|
| 4,476,601 | 10/1984 | Oka | 15/88.3 |
| 5,345,639 | 9/1994 | Tanoue et al. | |
| 5,518,542 | 5/1996 | Matsukawa et al. | 15/77 |
| 5,518,552 | 5/1996 | Tanoue et al. | |
| 5,675,856 | 10/1997 | Itzkowitz | 15/102 |
| 5,858,112 | 1/1999 | Yonemizu | 15/77 |
| 5,868,866 | 2/1999 | Maekawa et al. | 15/102 |

FOREIGN PATENT DOCUMENTS 6-45303   2/1994   Japan .

*Primary Examiner*—Terrence R. Till
*Attorney, Agent, or Firm*—Rader, Fishman & Grauer

[57] ABSTRACT

A scrubbing apparatus comprises a holding member, which holds the outer circumference of the substrate from its back surface and has an opening to expose the back surface of the held substrate toward the bottom side; a supporting member, which supports substantially the center between two opposed sides of the holding member; a scrubbing brush, which comes in contact with the exposed back surface of the substrate from the bottom side; a brush drive mechanism, which transfers the scrubbing brush along the two opposed sides of the holding member; and a rotation drive mechanism, which drives to rotate the holding member together with the supporting member. Thus, a space can be saved, and the back surface of the substrate can be scrubbed.

15 Claims, 15 Drawing Sheets

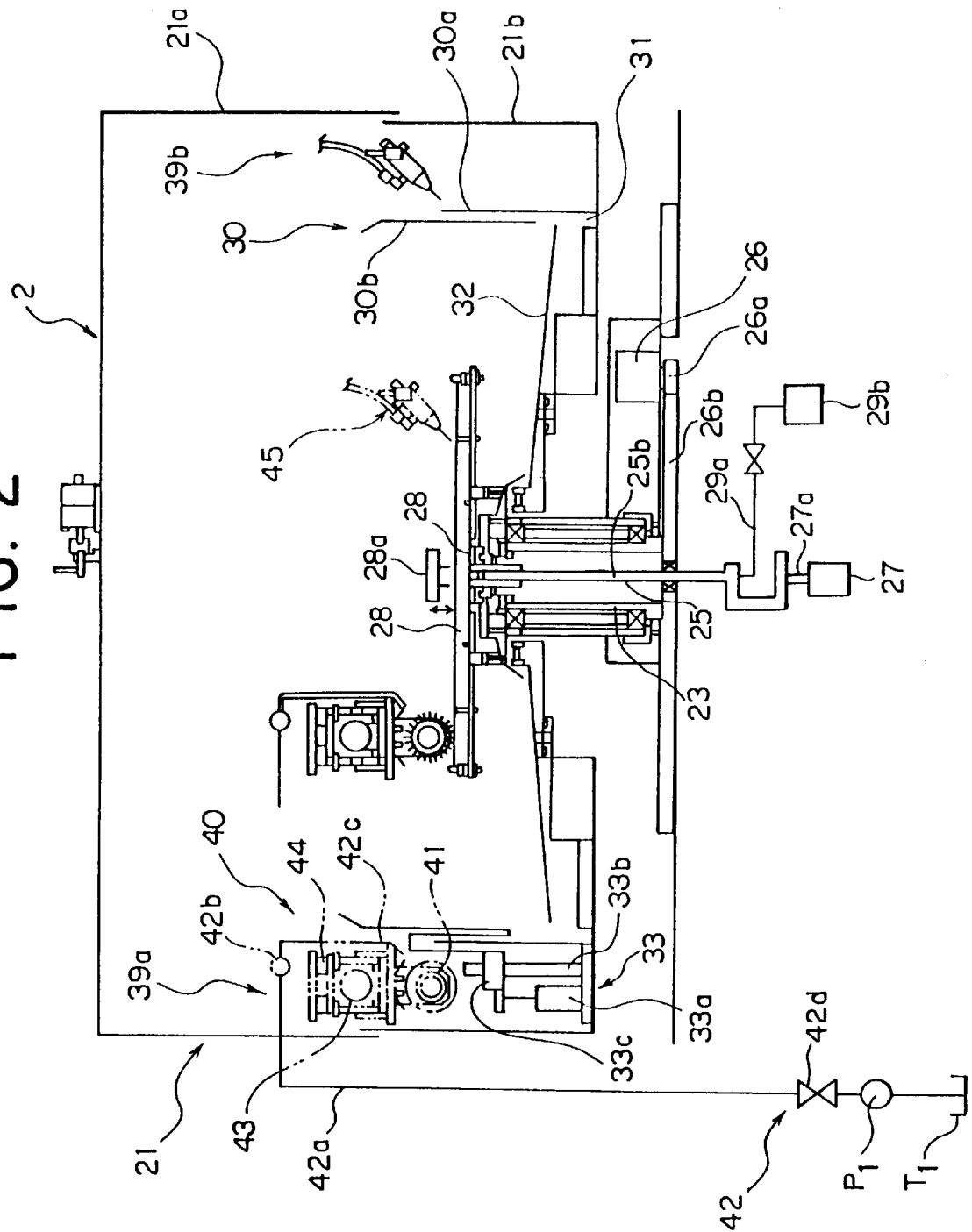

SCRUBBING APPARATUS AND SCRUBBING METHOD

BACKGROUND OF THE INVENTION

1. Field of the Invention

The invention relates to a scrubbing apparatus for scrubbing a substrate of a liquid crystal display (LCD) or the like, and more particularly to a scrubbing apparatus for scrubbing the back surface of a substrate and its scrubbing method.

2. Description of the Related Art

In manufacturing a substrate of a liquid crystal display (LCD) or the like, a scrubbing brush is conventionally used to scrub the substrate.

Demands for scrubbing not only the front surface but also the back surface of the substrate are increasing in these years. Accordingly, a known substrate scrubbing apparatus, as disclosed in Japanese Patent Laid-Open Application No. Hei 6-45303, has a roller transfer mechanism which comprises a plurality of rollers to form a predetermined substrate transferring path and a plurality of scrubbing brushes disposed among the rollers with the substrate transferring path therebetween, and scrubs both sides of the substrate such as a glass substrate for the LCD by the scrubbing brushes while transferring the substrate in one direction by the roller transfer mechanism.

However, since the above conventional scrubbing apparatus scrubs the substrate while transferring it in a horizontal direction by a track transferring unit or the like, it has a disadvantage that its size becomes large. Since the scrubbing apparatus is generally installed in a clean room, the large scrubbing apparatus results in a serious problem that the clean room becomes large, too.

SUMMARY OF THE INVENTION

It is an object of the invention to provide a scrubbing apparatus, which can save a space and scrub the back surface of a substrate to be scrubbed, and a scrubbing method.

It is another object of the invention to provide a scrubbing apparatus, which can save a space and scrub both sides of a substrate to be scrubbed in one and the same apparatus.

It is also an object of the invention to provide a scrubbing apparatus, which can prevent a watermark from being formed on a substrate to be scrubbed, while it is being scrubbed.

It is still another object of the invention to provide a maintenance-free scrubbing apparatus which prevents a substrate to be scrubbed from suffering from a crack due to its contact with guide pins formed on a holding member for holding the substrate, the guide pins being free from being abraded.

To achieve the above objects, the scrubbing apparatus according to a first aspect of the invention comprises a first supporting member, which supports the neighborhood of the outer circumference of the substrate from its back surface and has an opening to expose the back surface of the supported substrate toward the bottom side; a scrubbing brush, which comes in contact with the exposed back surface of the substrate from the bottom side; a brush transferring mechanism, which transfers the scrubbing brush along the two opposed sides of the first supporting member; a second supporting member, which supports substantially each center of two opposed sides of the first supporting member; and a rotation drive mechanism, which drives to rotate the first supporting member together with the second supporting member.

The scrubbing apparatus according to a second aspect of the invention comprises a holding member, which supports the neighborhood of the outer circumference of the substrate from its back surface and has an opening to expose the back surface of the supported substrate toward the bottom side; a scrubbing brush, which comes in contact with the exposed back surface of the substrate from the bottom side; a brush transferring mechanism, which transfers the scrubbing brush along the back surface of the substrate; a second supporting member which supports each diagonal position of the first supporting member; and a rotation drive mechanism, which drives to rotate the holding member together with the supporting member.

The scrubbing apparatus according to a third aspect of the invention comprises a holding member, which holds the neighborhood of the outer circumference of the substrate from its back surface and has an opening to expose the back surface of the held substrate toward the bottom side; a scrubbing brush, which comes in contact with the exposed back surface of the substrate from the bottom side; a brush transferring mechanism, which transfers the scrubbing brush along the exposed back surface of the substrate; a gas injection nozzle, which injects a drying gas to the exposed back surface of the substrate from the bottom side; and a nozzle transferring mechanism, which makes the gas injection nozzle scan the exposed back surface of the substrate.

The scrubbing apparatus according to a fourth aspect of the invention comprises a first holding member, which holds the neighborhood of the outer circumference of the substrate from its back surface, has an opening to expose the back surface of the held substrate toward the bottom side and can be separated to both sides; a scrubbing brush, which comes in contact with the exposed back surface of the substrate from below the bottom side; a brush drive mechanism, which transfers the scrubbing brush along the exposed back surface of the substrate; a separation drive mechanism, which drives to separate the first holding member to both sides; a second holding member, which is disposed below the first holding member to hold the substrate; a sending/receiving mechanism, which receives the substrate from the first holding member through the opening enlarged by the separation of the first holding member and sends it onto the second holding member; and a rotation drive mechanism, which drives to rotate the second holding member.

A fifth aspect of the invention relates to a scrubbing method of scrubbing the back surface of a substrate to be scrubbed, which comprises the steps of scrubbing substantially a half of the back surface of the substrate by a scrubbing brush; turning around the substrate by about 180 degrees; scrubbing the remaining half of the back surface of the substrate by the scrubbing brush; and rotating the substrate to spin-dry it.

According to the scrubbing apparatus of the first aspect of the invention and the scrubbing method of the fifth aspect of the invention, the substrate is supported by the first supporting member, and the back surface of the substrate is scrubbed by the scrubbing brush being transferred along the back surface. In scrubbing, the washing liquid is directly sprayed to the back surface of the substrate or supplied to the scrubbing brush. But, the scrubbing brush being transferred cannot scrub more than substantially a half of the back surface of the substrate because it is interfered with by the second supporting member. Therefore, after the above scrubbing, the first supporting member is turned around by about 180 degrees by the rotation drive mechanism, and the remaining half of the back surface of the substrate is scrubbed by the scrubbing brush. Then, the first supporting member is rotated by the rotation drive mechanism to spin-dry the substrate. Accordingly, since the invention transfers the scrubbing brush to scrub the substrate, namely the substrate is not required to be transferred while it is being scrubbed, the back surface of the substrate can be scrubbed in a very limited space. Besides, the substrate is spin-dried by rotating the first supporting member, so that it can be dried in the same space. In other words, the scrubbing apparatus of the invention can scrub the back surface of the substrate and dry it in a very limited space.

According to the scrubbing apparatus of the second aspect of the invention, the substrate is supported by the first supporting member and its back surface is scrubbed by the scrubbing brush being transferred along the back surface. In scrubbing, the washing liquid is directly sprayed to the back surface of the substrate or supplied to the scrubbing brush. In this scrubbing apparatus, the second supporting member secures the non-supporting regions to support the first supporting member and the non-supporting regions are utilized to transfer the scrubbing brush supported by a cantilever, so that the scrubbing brush can be transferred without being interfered with by the second supporting member. Thus, the entire back surface of the substrate can be scrubbed by a single stroke. Then, the first supporting member is rotated by the rotation drive mechanism to spin-dry the substrate. Accordingly, since the invention transfers the scrubbing brush to scrub the substrate, namely the substrate is not required to be transferred while it is being scrubbed, the back surface of the substrate can be scrubbed in a very limited space. Besides, the substrate is spin-dried by rotating the first supporting member, so that it can be dried in the same space. In other words, the scrubbing apparatus of the invention can scrub the back surface of the substrate and dry it in a very limited space. In addition, the invention can scrub the entire back surface of the substrate by a single stroke, thereby making the scrubbing time short.

According to the scrubbing apparatus of the third aspect of the invention, the substrate is held on the holding member and its back surface is scrubbed by the scrubbing brush being transferred along the back surface. In scrubbing, the washing liquid is directly sprayed to the back surface of the substrate or supplied to the scrubbing brush. Then, a drying gas is injected through the gas injection nozzle to dry the back surface of the substrate. Accordingly, since the invention transfers the scrubbing brush to scrub the substrate, namely the substrate is not required to be transferred while it is being scrubbed, the back surface of the substrate can be scrubbed in a very limited space. Besides, the drying gas is injected through the gas injection nozzle to dry the substrate, so that it can be dried in the same space. In other words, the scrubbing apparatus of the invention can scrub the back surface of the substrate and dry it in a very limited space. In addition, the invention dries the substrate by the gas injection nozzle, eliminating the necessity of a mechanism to rotate the holding member. Thus, the construction can be made simple. But, the holding member may be rotated while the substrate is being dried by the gas injection nozzle. Accordingly, the drying time can be made short.

According to the scrubbing apparatus of the fourth aspect of the invention, the substrate is held on the first holding member and its back surface is scrubbed by the scrubbing brush being transferred along the back surface. In scrubbing, the washing liquid is directly sprayed to the back surface of the substrate or supplied to the scrubbing brush. Accordingly, since the invention transfers the scrubbing brush to scrub the substrate, namely the substrate is not required to be transferred while it is being scrubbed, the back surface of the substrate can be scrubbed in a very limited space. Besides, the substrate is transferred to the second drying member which is disposed below the first holding member, the second holding member is rotated to spin-dry the substrate with a drying gas injected simultaneously. Thus, the drying can be made in the same area. In other words, the scrubbing apparatus of the invention can scrub the back surface of the substrate and dry it in a very limited space.

BRIEF DESCRIPTION OF THE DRAWINGS

FIG. 2 is a front view illustrating the structure of a surface scrubbing apparatus;

DESCRIPTION OF PREFERRED EMBODIMENTS

Preferred embodiments of the invention will be described with reference to the accompanying drawings.

Figure 1A:
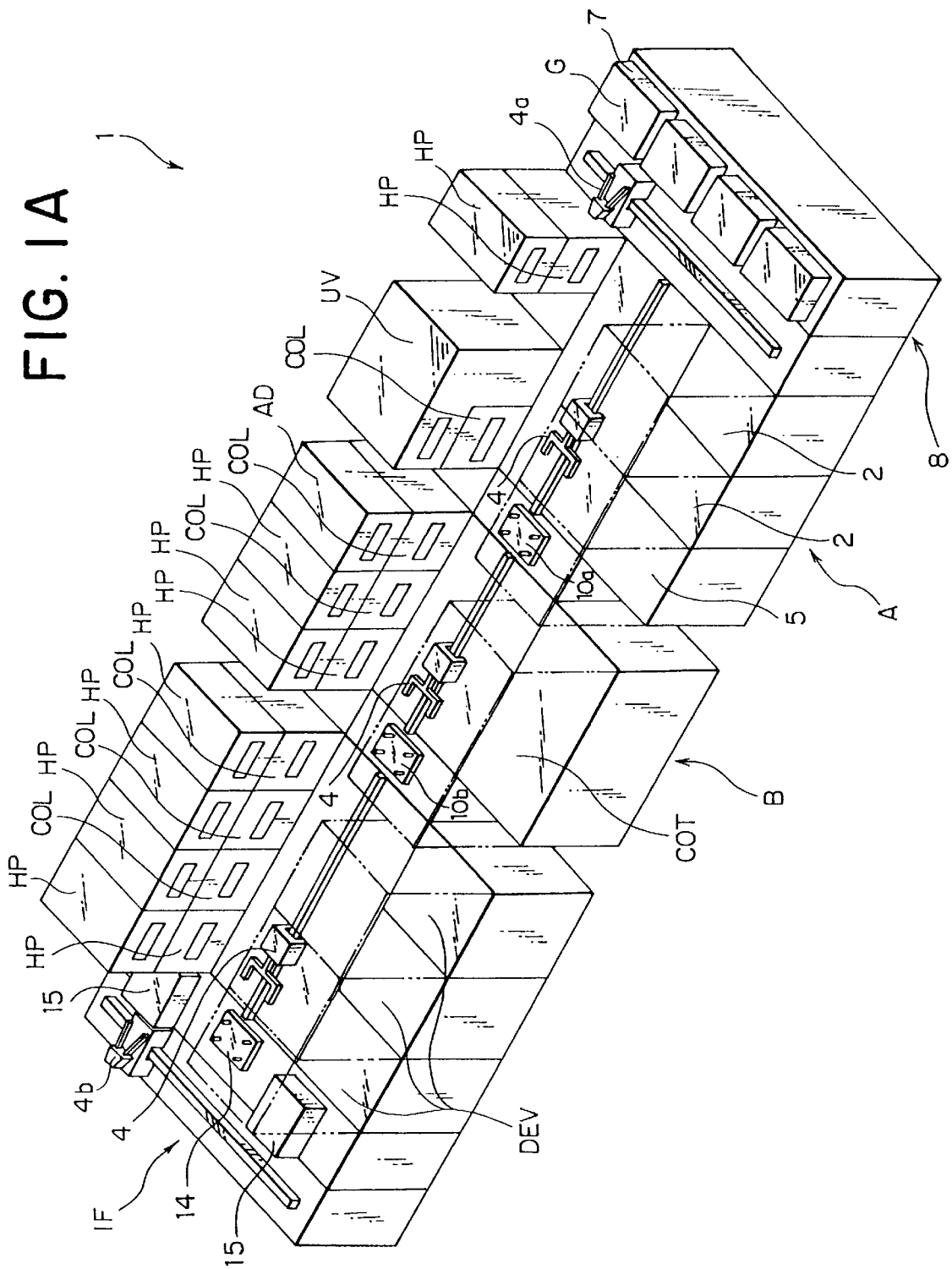
FIG. 1A is a perspective view showing the entire structure of a machine to which the scrubbing apparatus of the invention is applied.
Figure 1B:
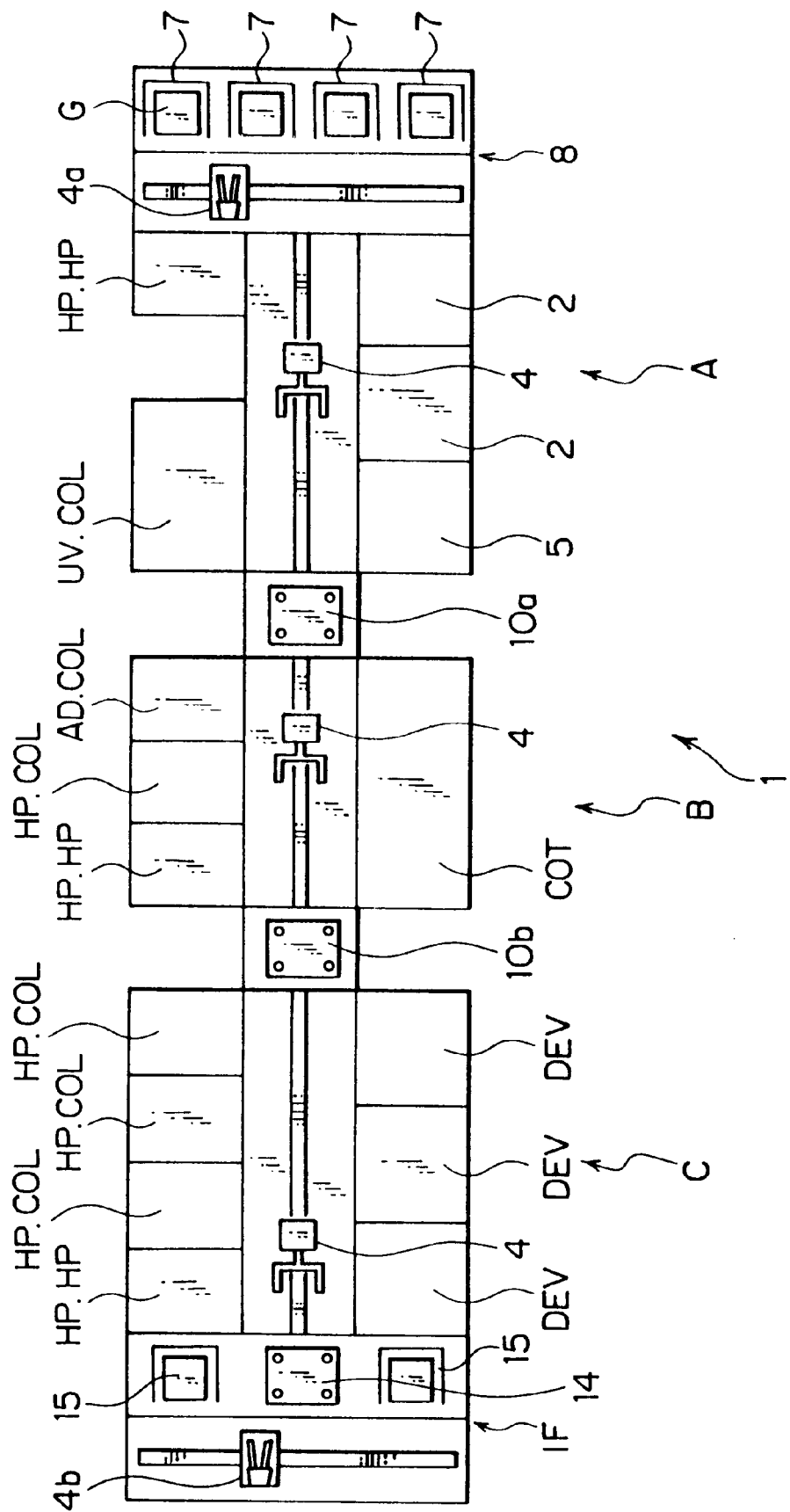
FIG. 1B is a plan view of FIG. 1A.
Figure 3:
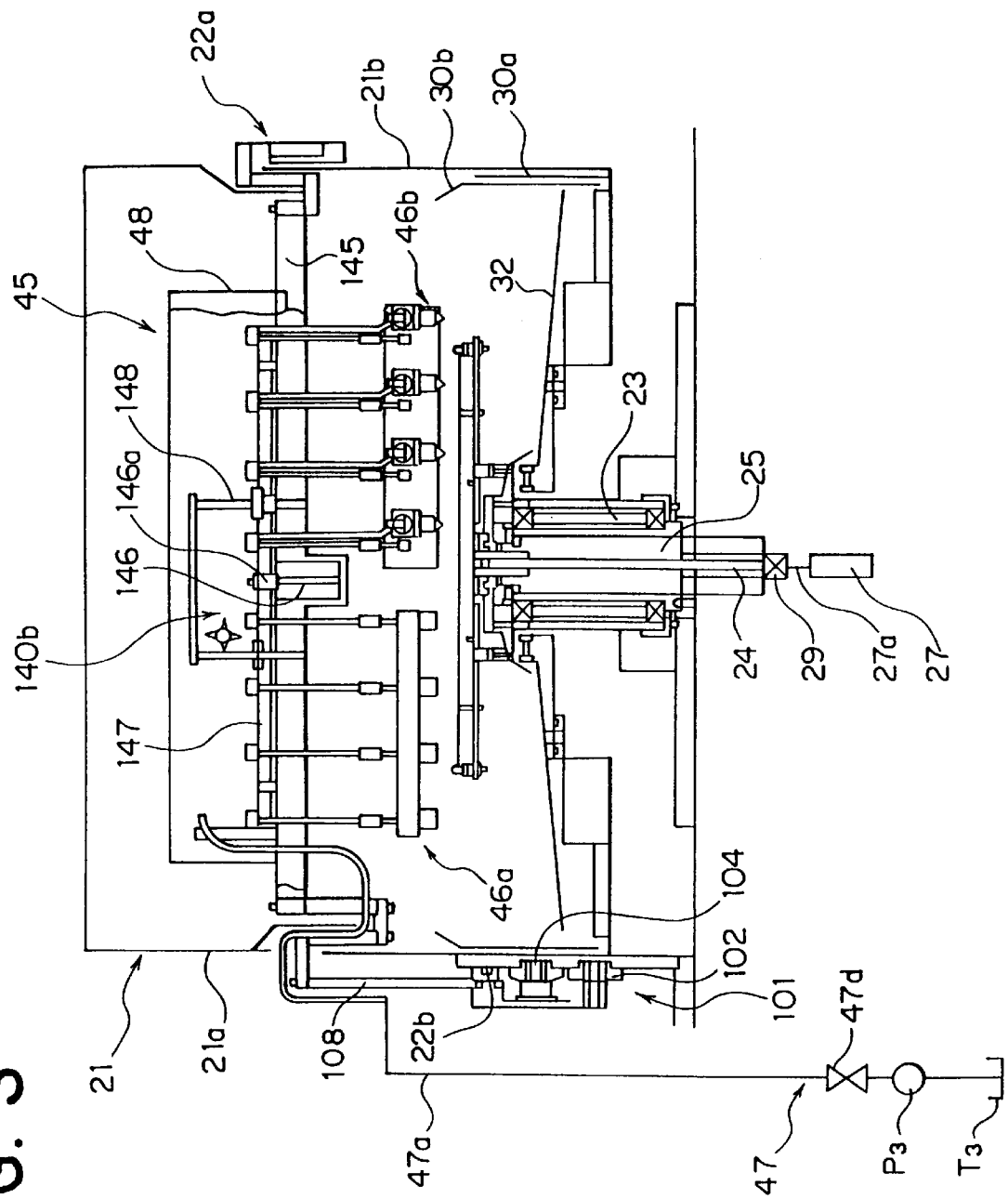
FIG. 3 is a right side view illustrating the structure of a surface scrubbing apparatus.
Figure 4:
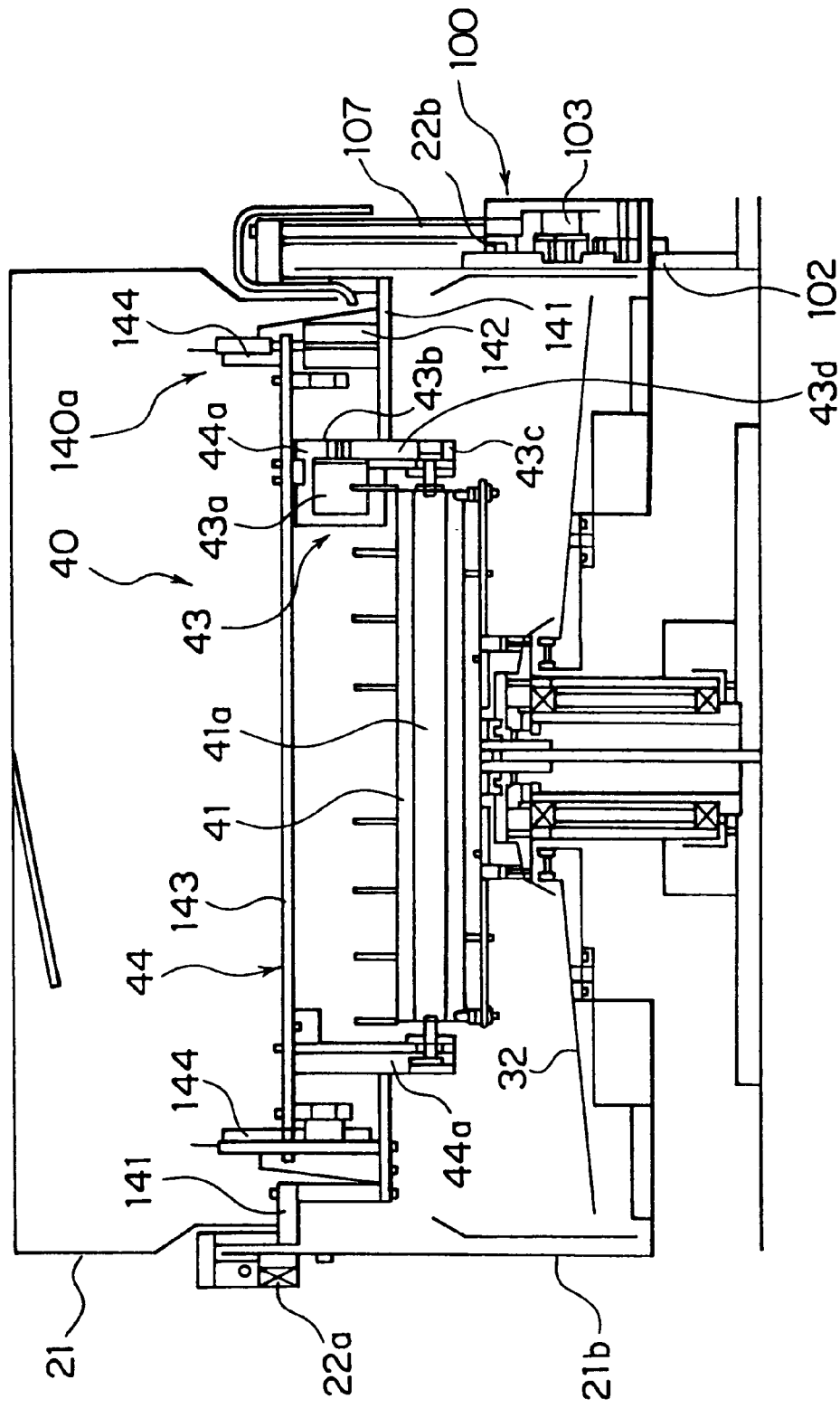
FIG. 4 is a left side view illustrating the structure of a surface scrubbing apparatus.
Figure 5:
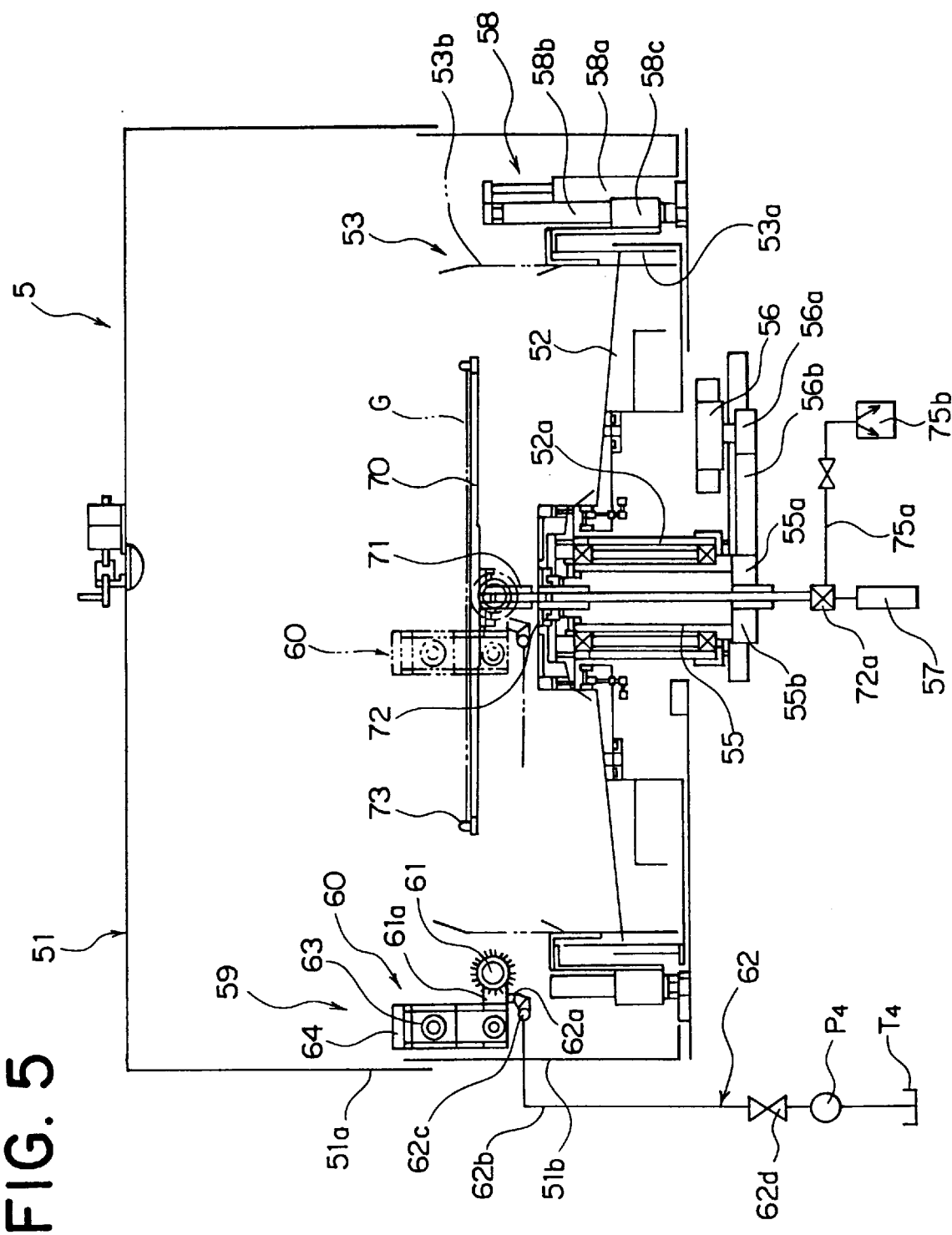
FIG. 5 is a front view illustrating the structure of the back surface scrubbing apparatus according to a first embodiment of the invention.
Figure 6:
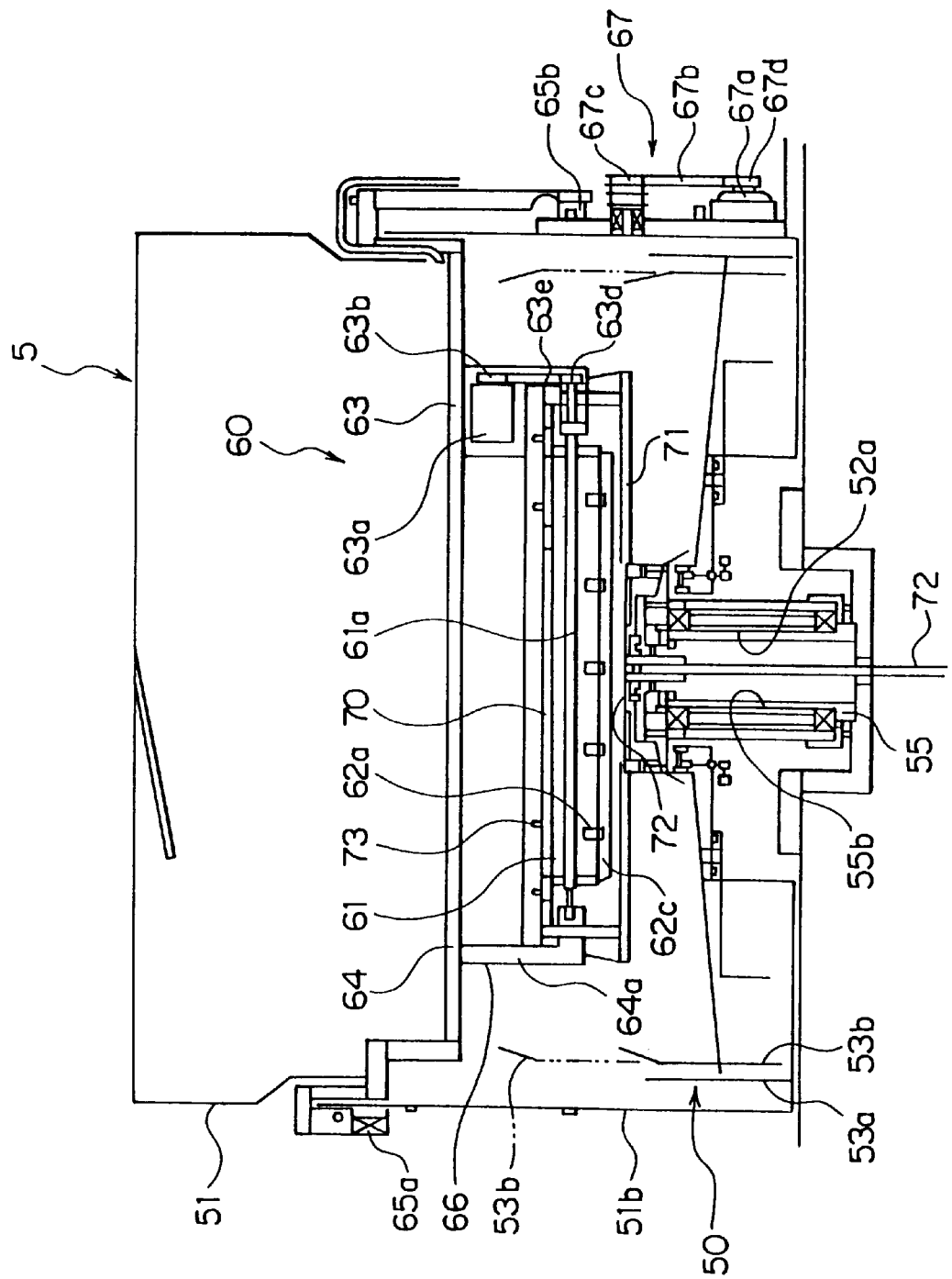
FIG. 6 is a side view illustrating the structure of the back surface scrubbing apparatus according to the first embodiment of the invention.
Figure 7:
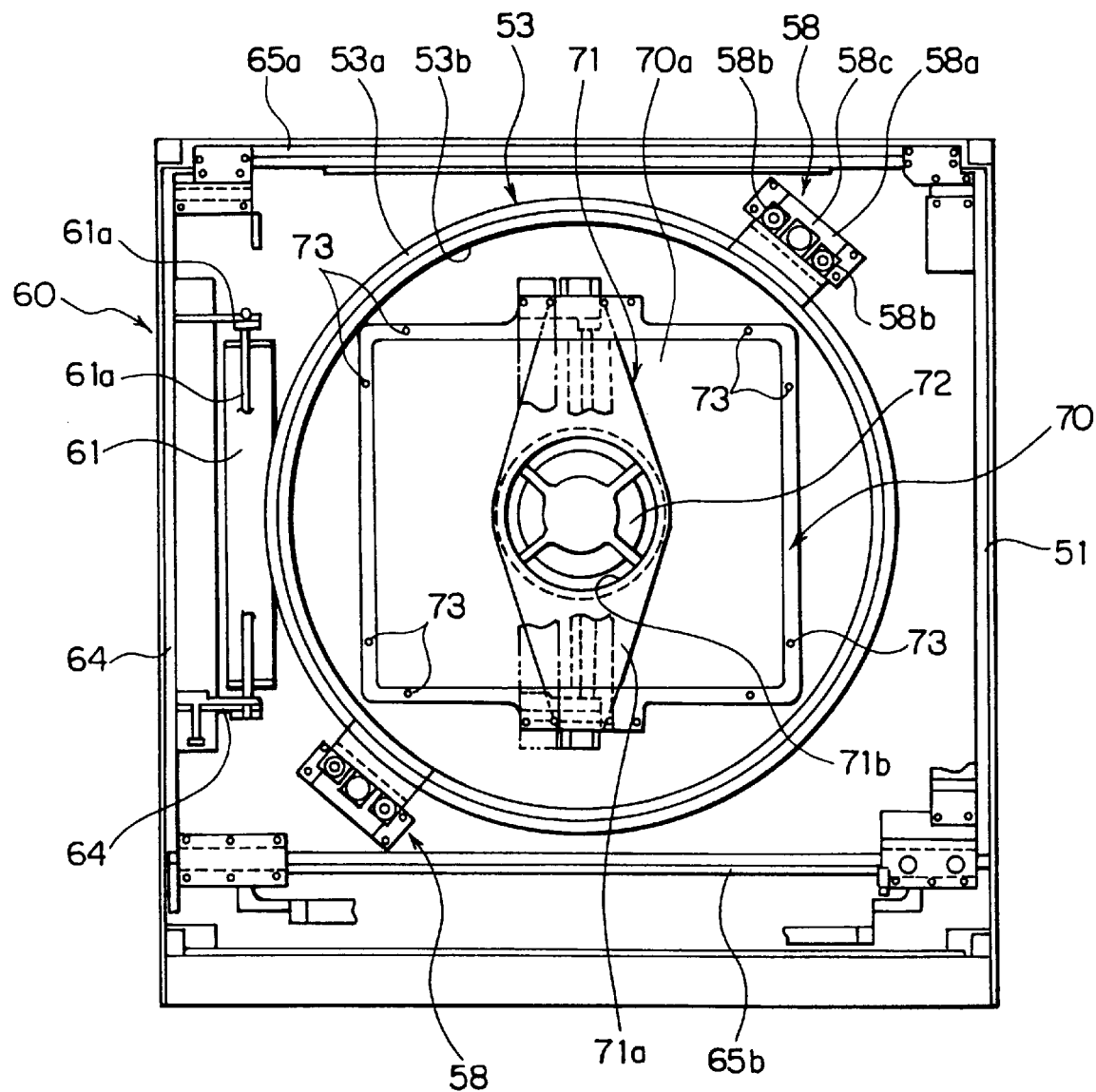
FIG. 7 is a plan view illustrating the structure of the back surface scrubbing apparatus according to the first embodiment of the invention.
Figure 8:
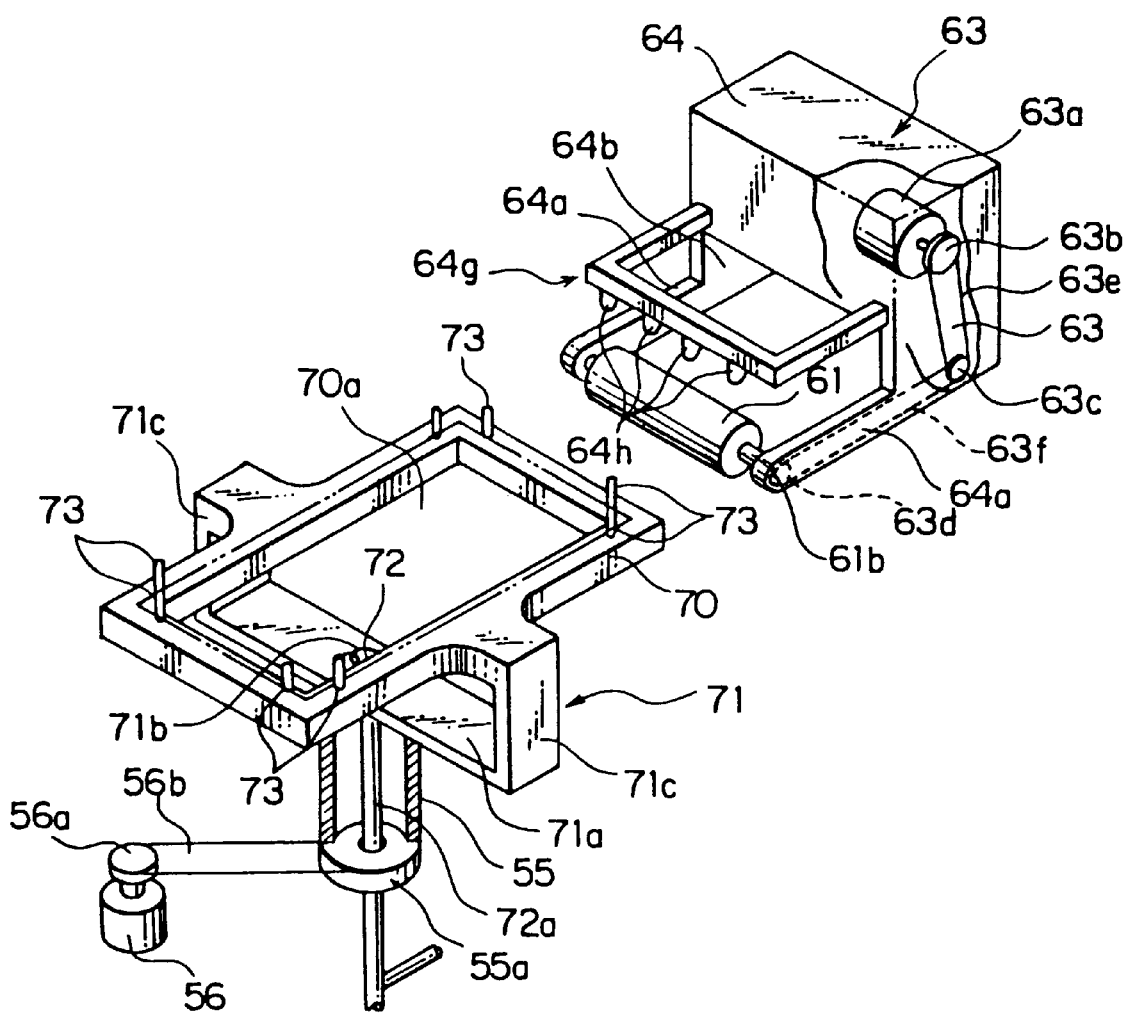
FIG. 8 is a perspective view illustrating the structure of main parts of the back surface scrubbing apparatus according to the first embodiment of the invention.
Figure 9A:
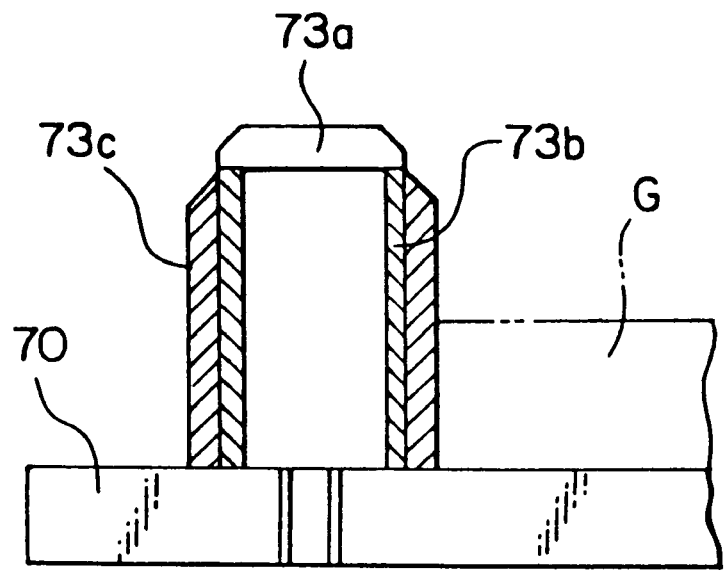
FIG. 9A is a sectional view of a guide pin.
Figure 9B:
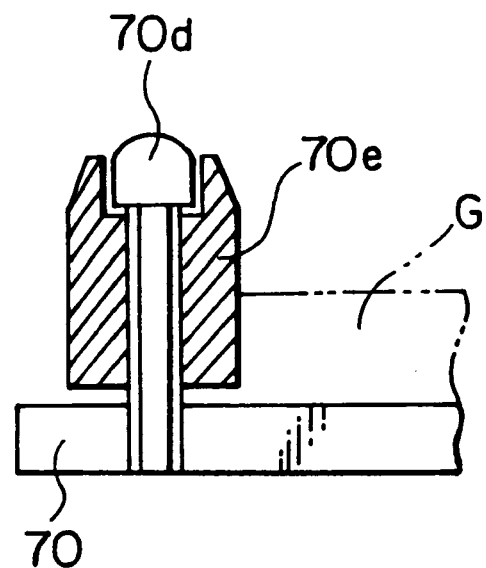
FIG. 9B is a sectional view showing another embodiment of the guide pin.

FIG. 1A and FIG. 1B are diagrams illustrating the entire structure of a machine to which the scrubbing apparatus of the invention is applied. FIG. 2 through FIG. 4 are diagrams illustrating the structure of a surface scrubbing apparatus for scrubbing the surface of a substrate. FIG. 5 through FIG. 7 are explanatory diagrams of the structure of a back surface scrubbing apparatus according to a first embodiment of the invention. FIG. 8 is a perspective view of main part of the first embodiment of the invention. FIGS. 9A and 9B are explanatory diagrams of a guide pin. FIGS. 10A to 10C and FIGS. 11A to 11C are explanatory diagrams of operation of the first embodiment of the invention.

A coating and developing apparatus 1 shown in FIG. 1A and FIG. 1B has a cassette station 8 at its one end.

And, the other end of the coating and developing apparatus 1 has an interface unit I/F, which sends and receives a substrate G to/from an exposure device (not shown).

The cassette station 8 has a plurality of cassettes 7 accommodating the substrate G such as an LCD substrate placed thereon. An auxiliary arm 4a is disposed on the side of the front surface of the cassette 7 of the cassette station 8 to transfer and position the substrate G to be treated and to hold the substrate G to send and receive it to/from a main arm 4.

The interface unit I/F has an auxiliary arm 4b which sends and receives the substrate G to/from an exposure device (not shown). And, the interface unit I/F has an extension 14 for sending and receiving the substrate G to/from the main arm 4 and a buffer unit 15 for temporarily holding the substrate G.

There are disposed three main arms 4 in series with each other so to move in a longitudinal direction along the center of the coating and developing apparatus 1. And, first to third treatment units A to C are disposed on both sides of the transferring paths of the respective main arms 4. A first joint portion 10a is disposed between the first treatment unit A and the second treatment unit B to temporarily hold and also cool the substrate B. And, a second joint portion 10b is disposed between the second treatment unit B and the third treatment unit C to temporarily hold and also cool the substrate B.

In the first treatment unit A, two front surface scrubbing units 2 for scrubbing the front surface of the substrate G and a back surface scrubbing unit 5 for scrubbing the back surface of the substrate G are disposed in parallel with the cassette station 8. Two vertically stacked heating treatment units HP are disposed next to two vertically stacked UV treatment units UV and a cooling unit COL on the side opposite from the front surface scrubbing units 2 and the back surface scrubbing unit 5 with the transferring path of the main arm 4 therebetween.

The second treatment unit B includes a coating treatment unit COT for coating a resist and removing it from an edge. Vertically stacked adhesion unit AD and cooling unit COL for performing hydrophobic treatment of the substrate G, vertically stacked heating treatment unit HP and cooling unit COL, and two vertically stacked heating treatment units HP are disposed adjacent to each other to face the coating treatment unit COT with the transferring path of the main arm 4 between them.

The third treatment unit C has three developing treatment units DEV for performing developing treatment. Three pairs of vertically stacked heating treatment units HP and cooling units COL and two vertically stacked heating treatment units HP are disposed adjacent to each other to face the developing treatment units DEV with the transferring path of the main arm 4.

The main arm 4 has an X-axis drive mechanism, a Y-axis drive mechanism, and a Z-axis drive mechanism. And, it also has a rotating drive mechanism so to rotate about the Z-axis. The main arm 4 travels as required along the center path of the coating and developing apparatus 1 to transfer the substrate G among the respective treatment units. The main arm 4 also sends the substrate G to be treated into the respective treatment units and receives the treated substrate G from the respective treatment units.

The front surface scrubbing unit 2 for scrubbing the front surface of the substrate G, as shown in FIG. 2 through FIG. 4, has a brush scrubbing apparatus (scrubber) 40 for scrubbing the surface of the substrate G, a high-pressure and ultrasonic washing apparatus 45 for washing the surface of the substrate G by a high-pressure water jet and an ultrasonic water stream, a mechanical chuck 28 for holding the substrate G to horizontally rotate it, and a cup 30 surrounding the mechanical chuck 28 and the substrate G. And, the brush scrubbing apparatus 40, the high-pressure and ultrasonic washing apparatus 45, the mechanical chuck 28 and the cup 30 are housed in a rectangular container 21 consisting of an upper container 21a and a lower container 21b.

The brush scrubbing apparatus 40, as shown in FIG. 2 and FIG. 4, comprises a brush supporting member 44 which is movable back and forth in a direction parallel with one side of the substrate G within the container 21, arms 44a, 44a which are formed on the brush supporting member 44 so to be wider than the width of another side neighboring to the above-described side of the substrate G, a rotating shaft 41a (see FIG. 4) which is rotatably and horizontally supported by the ends of the arms 44a, 44a, a scrubbing brush 41 which is rotatable together with the rotating shaft 41a and has a width substantially the same as that of one side of the substrate G, a washing liquid feeding mechanism 42 for supplying a washing liquid (rinse) to the scrubbing brush 41, and a brush rotating mechanism 43 for rotating the scrubbing brush 41 together with the rotating shaft 41a.

The washing liquid feeding mechanism 42, as shown in FIG. 2, comprises a washing liquid tank T1 disposed outside of a container 21, a pressure pump P1 for forcing the washing liquid from the washing liquid tank T1 to a washing liquid feeding pipe 42a, a valve 42d disposed at some midpoint in the washing liquid feeding pipe 42a, a plurality of washing liquid injection nozzles 42c which are disposed at equal intervals in the longitudinal direction of the scrubbing brush 41 to inject the washing liquid fed by the pressure pump P1 against the scrubbing brush 41, and a branched pipe 42b which is disposed on the brush supporting member 44 to distribute the washing liquid coming through the washing liquid feeding pipe 42a to the respective washing liquid injection nozzles 42c. To scrub the surface of the substrate G by the scrubbing brush 41, the valve 42d is opened to flow the washing liquid to the washing liquid injection nozzles 42c, and the washing liquid is injected from the washing liquid injection nozzles 42c to the scrubbing brush 41.

The brush rotating mechanism 43, as shown in FIG. 4, comprises a motor 43a mounted on the supporting member 44, pulleys 43b, 43c fitted to the drive shaft of the motor 43a and the rotating shaft 41a, and a belt 43d which is passed around the pulleys 43b, 43c. Rotation of the pulley 43b by the motor 43a is transmitted to the pulley 43c via the belt 43d to rotate the rotating shaft 41a.

The high-pressure and ultrasonic washing apparatus 45, as shown in FIG. 2 and FIG. 3, is positioned to face the brush scrubbing apparatus 40 in the container 21 and comprises a nozzle supporting member 48 which is movable back and forth in the same direction as the brush scrubbing apparatus 40, spray nozzles 46a disposed on the nozzle supporting member 48, ultrasonic washing liquid injection nozzles 46b for injecting the washing liquid in the form of an ultrasonic water flow, and a washing liquid feeding mechanism 47 for feeding the washing liquid to the spray nozzles 46a and the ultrasonic washing liquid injection nozzles 46b.

The spray nozzles 46a may be replaced by jet nozzles. The jet nozzle may be one which injects a high-pressure water jet against the substrate G by additionally pressurizing the washing liquid fed by the washing liquid feeding mechanism 47 to 100 to 150 kgf/cm².

The ultrasonic washing liquid injection nozzle 46b has an oscillator to produce supersonic waves of about 1.5 MHz and injects the washing liquid as an ultrasonically oscillated water flow against the substrate G.

The spray nozzles 46a and the ultrasonic washing liquid injection nozzles 46b are disposed in multiple numbers in the longitudinal direction of the supporting member 48 to oppose mutually with the center of the substrate G between them.

The washing liquid feeding mechanism 47, as shown in FIG. 3, comprises a washing liquid tank T3 disposed outside of the container 21, a pressure pump P3 which forces the washing liquid from the washing liquid tank T3 to a washing liquid feeding pipe 47a, a valve 47d disposed at some midpoint in the washing liquid feeding pipe 47a, and a branched pipe (not shown) which is disposed on the nozzle supporting member 48 to distribute the washing liquid coming through the washing liquid feeding pipe 42a to the respective nozzles 46a, 46b.

A pair of guides 22a, 22b, which is parallel with one side of the substrate G, is disposed on the outer face of the longer side of the rectangular container 21. As shown in FIG. 3 and FIG. 4, the brush supporting member 44 and the nozzle supporting member 48 of the brush scrubbing apparatus 40 and the high-pressure and ultrasonic washing apparatus 45 are guided by the guides 22a, 22b to move backward. A drive member such as a motor (not shown) and brush drive mechanisms 100, 101 consisting of a pulley mechanism rotated by the motor are disposed below one side of the container 21 having the guide 22b.

The brush supporting member 44 and the nozzle supporting member 48 are moved back and forth along the guides 22a, 22b by the brush drive mechanism 100 and the nozzle drive mechanism 101, respectively. The brush drive mechanism 100 and the nozzle drive mechanism 101 comprise pulleys 103, 104 (one on the other side is not shown) which are mounted on both ends of the guide 22b, belts which are passed around the pulleys 103, 104 respectively, and motors (not shown) as drive members to rotate the pulleys 103, 104; thereby running the belts. And, connecting members 107, 108, which are fitted to one end of the brush supporting member 44 and the nozzle supporting member 48 and vertically suspended along one side of the container 21, are engaged with the belts. And, the brush supporting member 44 and the nozzle supporting member 48 can be moved along the guides 22a, 22b as the belts are moved. The motor drive of the brush drive mechanism 100 and the nozzle drive mechanism 101 is controlled by an instruction signal from a control (not shown).

The mechanical chuck 28 is fixed to the top end of a hollow up-and-down shaft 25 which is vertically mounted at the center of the lower container 21b. A cylindrical member 23 is rotatably mounted at substantially the center of the lower container 21b through a bearing, and the up-and-down shaft 25 is inserted into the through hole of the cylindrical member 23.

The lower end of the cylindrical member 23 has a pulley. A motor 26 as a rotation drive member to rotate the cylindrical member 23 is positioned not coaxial with the cylindrical member 23, and its drive shaft has a pulley 26a. A belt 26b is passed around the pulley of the cylindrical member 23 and the pulley 26a so to transmit the force of the motor 26 to the cylindrical member 23 via the pulley 26a, the belt 26b and the pulley of the cylindrical member 23. And, a cylinder 27 is disposed as the up-and-down drive member below the up-and-down shaft 25, and the leading end of a piston rod 27a, along which the cylinder 27 is movable up and down, is connected to the lower end of the up-and-down shaft 25 via a bearing.

A through hole 25b of the up-and-down shaft 25 serves as an air intake pipe for flowing the air taken from an up-and-down VAC pad of an up-and-down lifter 28a. A rod 24 extends to below the up-and-down shaft 25, and its bottom end is connected to an air intake pipe 29a which is connected to an air intake pump 29b.

The cup 30, which accommodates the mechanical chuck 28 and the substrate G, consists of an outer cup 30a fixed to the bottom of the lower container 21b and an inner cup 30b which moves up and down along the inner periphery of the outer cup 30a. Reference numeral 31 is a drain gutter formed along the peripheral edge of the outer cup 30. The cup 30 has in it a base 32 which is inclined downward from the up-and-down shaft 25 toward its edge. The base 32 allows the washing liquid fed to the substrate G to flow down to the periphery of the cup 30, thereby facilitating to recover the washing liquid into the drain gutter 31.

The inner cup 30b inside the outer cup 30a is moved up and down by an up-and-down drive mechanism 33 which is disposed outside of the outer cup 30a. The up-and-down drive mechanism 33, as shown in FIG. 2, consists of a cylinder 33a as the up-and-down drive member, a guide 33b vertically erected in parallel with the up-and-down direction of the piston rod of the cylinder 33a, and a slider 33c which moves up and down along the guide 33b. And, the inner cup 30b is fixed to the slider 33c. The up-and-down drive mechanism 33 lifts the inner cup 30b to a predetermined height to prevent the washing liquid from being dispersed within the container 21 when both sides of the substrate G are washed by injecting the washing liquid from respective nozzles 46a, 46b and the like while rotating the substrate G or when the substrate G is dried by spinning off the washing liquid. The circular cup 30 of this embodiment is disposed in contact with the inner wall of the rectangular container 21, and a space is provided between the cup 30 and either side of the container 21 in its longitudinal direction as shown in FIG. 2. In other words, standby positions 39a, 39b are provided for the brush scrubbing apparatus 40 and the ultrasonic washing apparatus 45. To wash the front and back surfaces of the substrate G by injecting the washing liquid and to dry the substrate G by spinning off the washing liquid, the brush scrubbing apparatus 40 is on standby in the standby position 39a, and to scrub the front surface by the scrubbing brush 41, the ultrasonic washing apparatus 45 is on standby in the standby position 39b.

The brush scrubbing apparatus 40 and the ultrasonic washing apparatus 45 have up-and-down mechanisms 140a, 140b as shown in FIG. 3 and FIG. 4 to enable the up and down movement of the scrubbing brush 41 and the spray nozzles 46a and the ultrasonic washing liquid injection nozzles 46b of the ultrasonic washing apparatus 45. When the brush scrubbing apparatus 40 and the ultrasonic washing apparatus 45 are moved from the standby positions 39a, 39b toward the substrate G, the up-and-down mechanisms 140a, 140b lift the scrubbing brush 41 and the nozzles 46a, 46b to a level to prevent them from interfering with the inner cup 30b in the raised state.

The up-and-down drive mechanism 140a for the scrubbing brush 41, as shown in FIG. 4, consists of a cylinder 142 as the drive member mounted on a main body 141 configuring the brush supporting member 44, guides 144, 144 erected on both sides of the main body 141, and a beam-type arm mounting member 143. This arm mounting member 143 is stretched between the guides 144 and 144 and guided by them to freely move up and down and has the arms 44a, 44a and the brush rotating mechanism 43. The arm-mounting member 143 is engaged with a vertically movable piston rod of the cylinder 142. When the piston rod is extended or contracted by the movement of the cylinder 142, the arm mounting member 143 is moved up or down together with the arms 44a, 44a, the scrubbing brush 41 and the brush rotating mechanism 43 fitted to the arm mounting member 143.

The up-and-down drive mechanism 140b of the ultrasonic washing apparatus 45, as shown in FIG. 3, consists of a cylinder 146 mounted at the center of a beam-type main body 145 configuring the supporting member 48, a mounting member 147 for integrally mounting a branch pipe and the nozzles 46a, 46b, and a guide 148 erected on the main body 145. And, the branch pipe and the nozzles 46a, 46b are moved up and down together with the mounting member 147 by the movement of the cylinder 146.

Now, description will be made of the back surface scrubbing unit 5 which scrubs the back surface of the substrate G before the front surface scrubbing unit 2 scrubs the front surface. The back surface of the substrate G is scrubbed prior to the front surface because the front surface can be dried thoroughly as compared with the back surface.

The back surface scrubbing unit 5, as shown in FIG. 5, has a brush scrubbing apparatus 60 for scrubbing the back surface of the substrate G, a holding member 70 for holding the substrate G, and a cup 53 for surrounding the substrate G and the holding member 70. The brush scrubbing apparatus 60, the holding member 70 and the cup 53 are housed in a rectangular container 51 consisting of an upper container 51a and a lower container 51b.

The holding member 70, as shown in FIG. 7 and FIG. 8, is formed like a frame having an opening 70a at the center to expose the scrubbing back surface of the substrate G toward the bottom of the holding member 70. Specifically, the substrate G has its back surface edge caught by the holding member 70 to expose the back surface (to be washed) excepting the edge toward the bottom side through the opening. Guide pins 73 are erected on the holding member 70 to prevent the substrate G from being moved horizontally when the holding member 70 is rotated to perform the spin-drying. Two guide pins 73, as shown in FIG. 7 and FIG. 8, are formed on each of four corners of the frame type holding member 70 so to contact with two neighboring sides in the neighborhood of the four corners of the substrate G.

The holding member 70 has its two opposed sides supported at about the midpoint by a U-shaped supporting member 71. The supporting member 71 is mounted on the upper end of a hollow rotating shaft 55 which is freely rotatably supported at substantially the center of the lower container 51b and can be rotated when the rotating shaft 55 is rotated.

A through hole 71b is formed at the center of a bottom part 71a of the supporting member 71 so to communicate with a through hole 55b of the rotating shaft 55. And, a lifter 72 is provided to freely move up and down through the hole 71b. The lifter 72 vacuum-sucks the substrate G to lift it from the holding member 70 or to lower it toward the holding member 70.

A pulley 55a is fixed to the bottom end of the rotating shaft 55 as shown in FIG. 5. A motor 56 as the rotation drive member for rotating the rotating shaft 55 is located away from the rotating shaft 55, and its drive shaft has a pulley 56a. A belt 56b is passed around the pulleys 55a, 56a so to transmit the power of the motor 56 to the rotating shaft 55 via the pulley 56a, the belt 56b and the pulley 55a. The lifter 72 is fitted to the upper end of the through hole 55b of the rotating shaft 55, and a tubular rod 72a, which serves as an air intake pipe to flow the air taken from the lifter 72, is vertically inserted into the through hole 55b. The bottom end of the rod 72a is extended to below the rotating shaft 55 and connected to the leading end of a piston rod of a cylinder 57 which is disposed as the up-and-down drive member below the rotating shaft 55. And, an air intake pipe 75a, which is connected to an air intake pump 75b as air intake means, is connected to the bottom end of the rod 72a.

The brush scrubbing apparatus 60 consists of a brush supporting member 64 which is freely movable in a direction parallel to one side of the substrate G held by the holding member 70 in the container 51, arms 64a, 64a which are fitted to both sides of the brush supporting member 64, a rotating shaft 61b which is rotatably supported by the arms 64a, 64a, a scrubbing brush 61 which rotates together with the rotating shaft 61b, a brush rotating mechanism 63 for rotating the scrubbing brush 61 together with the rotating shaft 61b, and a washing liquid feeding mechanism 62 which is disposed in parallel with the rotatable shaft 61a to feed the washing liquid from a level below the rotating shaft 61b to the scrubbing brush 61.

The arms 64a, 64a are disposed to have a length wider than the width of one side of the substrate G but narrower than the width between both opposed erected parts 71c, 71c of the supporting member 71. The scrubbing brush 61 is horizontally supported by the arms 64a, 64a and has the same width as that of the opening 70a of the holding member 70 to enable scrubbing of the entire back surface of the substrate G exposed to the bottom side through the opening 70a. And, as shown in FIG. 8, the brush supporting member 64 has an opening 64b for preventing the brush supporting member 64 from interfering with the holding member 70 when the brush supporting member 64 is moved back and forth to scrub the back surface. A spray unit 64g is mounted on the brush-supporting member 64 to spray, for example, pure water to the surface of the substrate G the back surface of which is scrubbed. The spray unit 64g has, for example, four of spray nozzles 64h in line so to oppose the scrubbing brush 61. Thus, a water film is formed on the surface of the substrate G. Even if water droplets spattering in the washing unit adhere to the surface of the substrate G, patterns of water droplets are not marked on the substrate G because such water droplets actually adhere to the water film.

The washing liquid feeding mechanism 62, as shown in FIG. 5, consists of a washing liquid tank T4 disposed outside of the container 51, a pressure pump P4 for forcing the washing liquid from the washing liquid tank T4 to a washing liquid feeding pipe 62b, a valve 62d disposed at some midpoint in the washing liquid feeding pipe 62b, a plurality of washing liquid injection nozzles 62a which are disposed at equal intervals in the longitudinal direction of the scrubbing brush 61 to inject the washing liquid fed by the pressure pump P4 toward the scrubbing brush 61, and a branch pipe 62c which is disposed on the brush supporting member 64 to distribute the washing liquid coming through the washing liquid feeding pipe 62b to the respective washing liquid injection nozzles 62a. To scrub the back surface of the substrate G by the scrubbing brush 61, the valve 62d is opened to flow the washing liquid to the washing liquid injection nozzles 62a, and the washing liquid is injected from the washing liquid injection nozzles 62a to the scrubbing brush 61. It may be configured to inject the washing liquid directly from the washing liquid injection nozzles 62a to the substrate G.

The brush rotating mechanism 63 for rotating the scrubbing brush 61, as shown in FIG. 8, comprises a motor 63a mounted as a drive member on the supporting member 64, a pulley 63b fitted to the drive shaft of the motor 63a, pulleys 63c, 63d fitted to the supporting member 64 and the rotating shaft, and belts 63e, 63f which are passed around the pulleys 63b, 63c, 63d. When the motor 63a is activated, rotation of the drive shaft of the motor 63a is transmitted to the rotating shaft via the pulley 63b, the belt 63e, the pulley 63c, the belt 63f and the pulley 63d to rotate the scrubbing brush 61.

As shown in FIG. 6, a pair of guides 65a, 65b, which is parallel with one side of the substrate G, is disposed on the outer face of the longer side of the rectangular container 51. The brush-supporting member 64 is guided by the guides 65a, 65b to move back and forth. A brush drive mechanism 67 is disposed below one side of the container 51 having the guide 65b. The brush-supporting member 64 is moved back and forth along the guides 65a, 65b by the brush drive mechanism 67. The brush drive mechanism 67 is driven by an instruction signal from a control (not shown) to move the brush scrubbing apparatus 60 back and forth in a direction parallel with one side of the substrate G. The brush drive mechanism 67 consists of a pulley 67c (one on the other side is not shown) disposed on both ends of the guide 65b, a motor 67a as a drive member to rotate the pulley 67c, a pulley 67d fixed to the drive shaft of the motor 67a, and a belt 67b passed around the pulleys 67c, 67d. The belt 67b is engaged with a connecting member, which is fitted to one end of the brush-supporting member 64 and vertically suspended along one side of the container 51. And, the brush-supporting member 64 is moved along the guides 65a, 65b as the belt 67b is moved by driving the motor 67a. The motor drive of the brush drive mechanism 67 is controlled by an instruction signal from a control (not shown).

The cup 53 surrounding the holding member 70 and the substrate G serves in the same way as the front surface scrubbing unit 2 to prevent the washing liquid from scattering when the substrate G is rotated and to recover the washing liquid into a drain gutter (not shown). This cup 53 consists of an outer cup 53a fixed to the lower container 51b and an inner cup 53b which is mounted to freely move up and down with respect to the outer cup 53a.

An up-and-down drive mechanism 58 for moving up and down the inner cup 53b, as shown in FIG. 5 and FIG. 7, consists of a cylinder 58a positioned as a drive member not to interfere with the brush scrubbing apparatus 60, guides 58b which are erected on both sides of the cylinder 58a, and a slider 58c which is moved up and down along the guides 58b by the cylinder 58a. The slider 58c is fitted to the inner cup 53b, which is moved up and down as the slider 58c is moved up and down by the cylinder 58a. In the back surface scrubbing unit 5, the circular cup 53 is disposed in contact with the inner wall of the rectangular container 51 in the same way as the front surface scrubbing unit 2 as described above, and a space formed in the longitudinal direction serves as a standby position 59 for the brush scrubbing apparatus 60. When the substrate G is rotated to perform the spin-drying, the brush scrubbing apparatus 60 is on standby in the standby position 59.

Now, description will be made of guide pins 73 erected at four corners of the holding member 70. The guide pins 73 are in contact with the edge of the substrate G placed on the holding member 70 to prevent the substrate G from being displaced.

The guide pin 73 of this embodiment, as shown in FIG. 9A, consists of a pin proper 73a threaded into the holding member 70, an elastic member 73b made of a resin such as PPS or PEEK and disposed to surround the pin proper 73a, and a rigid cover 73c disposed to cover the surface of the elastic member 73b. The elastic member 73b is covered by the cover 73c because it is quickly abraded and required to be exchanged periodically if not covered.

Since the guide pins 73 are configured as described above, when the substrate G is transferred onto or from the holding member 70 or when the holding member 70 is rotated, the impact due to the contact of the substrate G 73 to the guide pins 73 is cushioned by the elastic member and the substrate G is prevented from having a crack or the like. As shown in FIG. 9B, an elastic member 70e may be fitted rotatably to a guide pin proper 70d.

The operation of the invention configured as described above will be described.

The substrate G is held by the main arm 4 shown in FIGS. 1A and 1B and sent to the back surface scrubbing unit 5. Scrubbing of the back surface by the back surface scrubbing unit 5 will be described with reference to FIGS. 10A to 10C and FIGS. 11A to 11C.

Figure 10A:
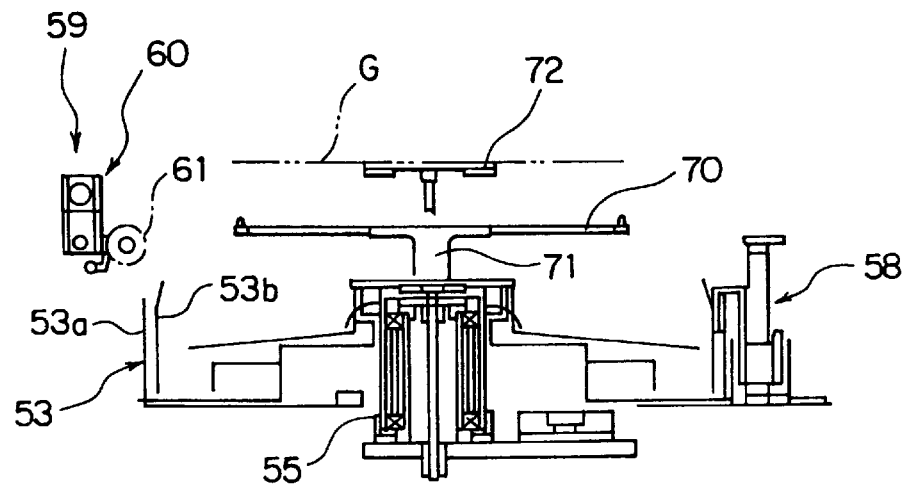
FIG. 10A, FIG. 10B and FIG. 10C are explanatory views of operation of the back surface scrubbing apparatus according to the first embodiment of the invention.
Figure 10B:
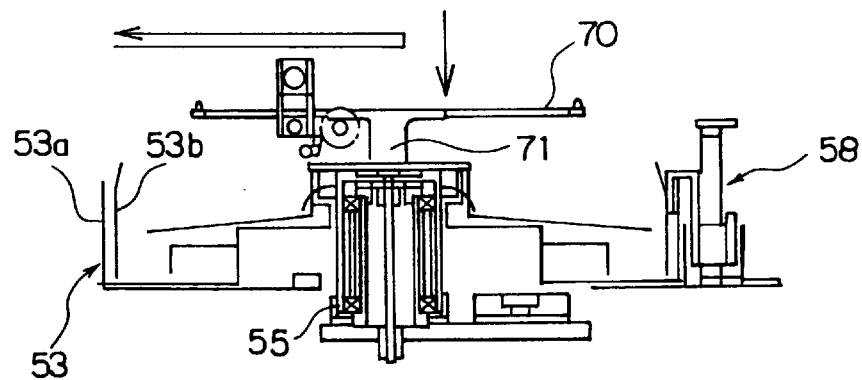
Figure 10C:
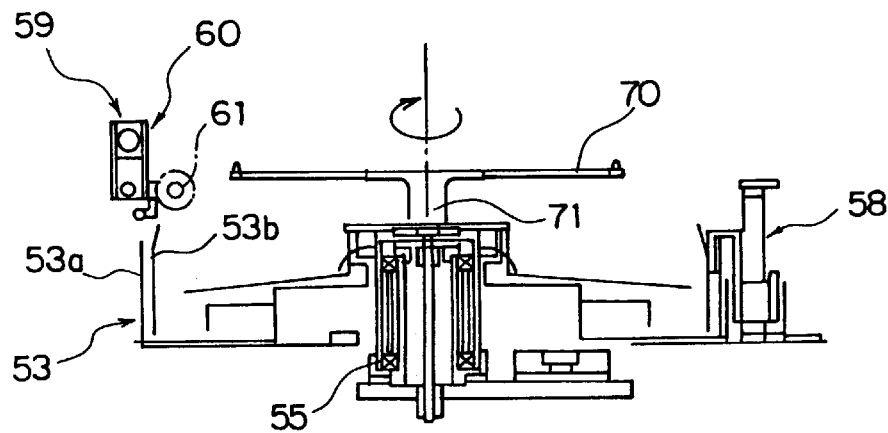

In the back surface scrubbing unit 5, the lifter 72 is moved upward by the cylinder 57 to vacuum-suck the substrate G, thereby receiving the substrate G from the main arm 4. Then, the lifter 72 lowers to give the substrate G to the holding member 70 (FIG. 10A). The substrate G is held and prevented from moving by the guide pins 73 of the holding member 70.

Figure 11A:
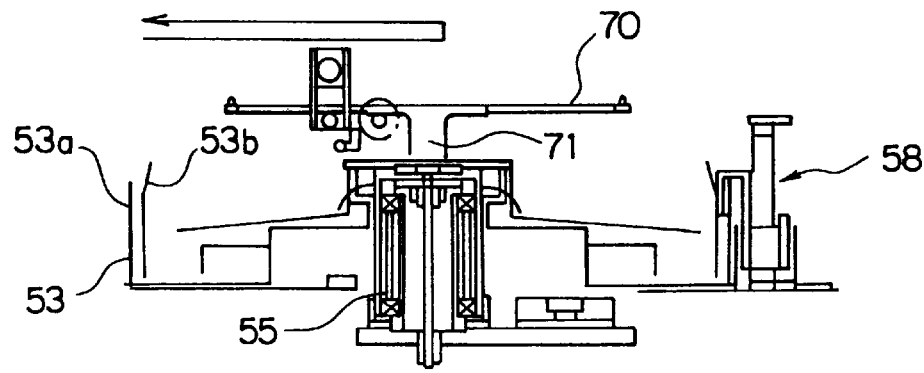
FIG. 11A, FIG. 11B and FIG. 11C are explanatory views of operation of the back surface scrubbing apparatus according to the first embodiment continuing from FIGS. 10A, 10B 10C.
Figure 11B:
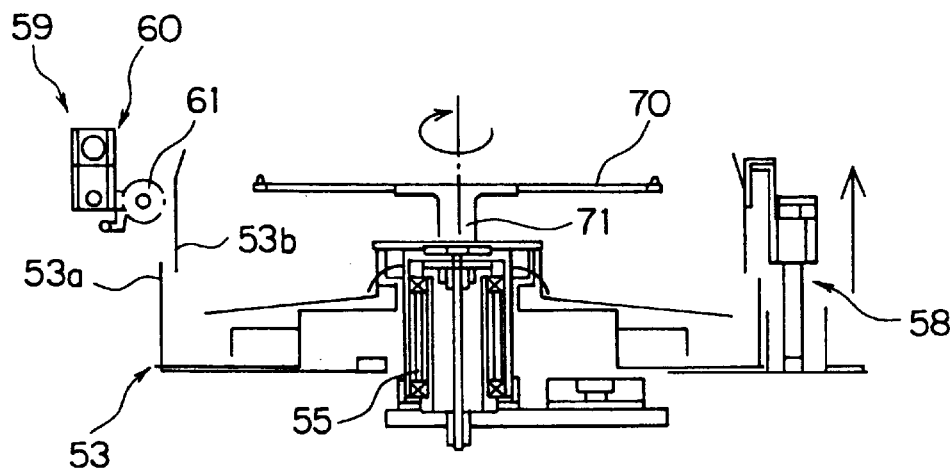

In scrubbing the back surface of the substrate G, which is held by the holding member 70, by the scrubbing brush 61 of the brush scrubbing apparatus 60, the brush rotating mechanism 63 is driven to rotate the scrubbing brush 61 and the washing liquid feeding mechanism 62 is activated to inject the washing liquid to the scrubbing brush 61. The washing liquid may be injected directly to the back surface of the substrate G. Then, the brush driving mechanism 67 is driven to move the rotating scrubbing brush 61 from the edge of the substrate G toward the center. Thus, the back surface of the substrate G is scrubbed. In the brush scrubbing apparatus 60, when the scrubbing brush 61 moves to exceed slightly the center of the substrate G, the brush supporting member 64 interferes with the supporting member 71, and additional scrubbing is stopped. Therefore, after scrubbing the half of the substrate G, the scrubbing brush 61 is returned to the starting position (FIG. 10B), the motor 56 is driven to turn around the holding member 70 together with the rotating shaft 55 (FIG. 10C), and the above-described procedure is repeated to scrub the remaining half of the substrate G (FIG. 11A). Then, the motor 56 is driven to rotate the holding member 70 at a predetermined speed to spin-dry the substrate G (FIG. 11B). Since the pin proper 73a is covered by the elastic member 73b and the surface of the elastic member 73b is further covered by the rigid cover 73c, the impact due to the contact of the substrate G to the guide pins 73 is cushioned by the elastic member 73b, and the substrate G is prevented from having a crack or the like.

Figure 11C:
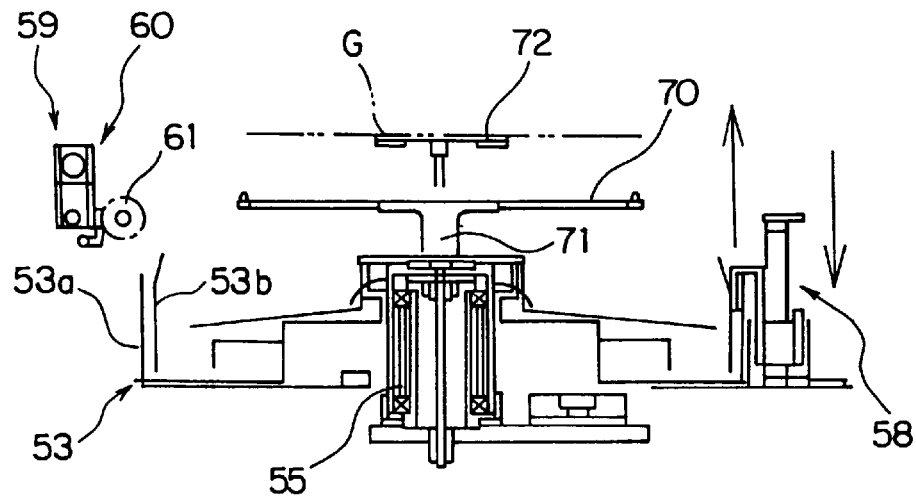

To perform the spin-drying of the substrate G, the brush scrubbing apparatus 60 is on standby in the standby position 59, and the up-and-down drive mechanism 58 is driven to raise the inner cup 53b. Upon completing the spin-drying, the substrate G is raised to a predetermined level by the lifter 72 to give it to the main arm 4 (FIG. 11C).

Since the invention scrubs the back surface of the substrate G by the scrubbing brush 61 which is being transferred, in other words, the substrate G is not required to be moved horizontally, the back surface can be scrubbed in a very limited space. Besides, since the substrate G is dried by rotating the holding member 70, it can be dried in the same space.

The substrate G having through the back surface scrubbing by the procedure described above is taken out of the back surface scrubbing unit 5 by reversing the procedure described above and transferred to the front surface scrubbing unit 2. And the main arm 4 moves and rotates in directions of axes X, Y, Z to give the substrate G to the front surface scrubbing unit 2.

Specifically, the substrate G is sent and received to/from the main arm 4 by raising the lifter 28a by the cylinder 27 and vacuum-sucking the substrate G onto the top face of the lifter 28a. Then, the lifter 28a lowers to a predetermined level to scrub the surface of the substrate G.

To scrub the front surface of the substrate G, the washing liquid feeding mechanism 42 is driven to supply the washing liquid from the washing liquid injection nozzles 42c to the scrubbing brush 41, the brush rotating mechanism 43 is also driven to rotate the scrubbing brush 41, and the brush drive mechanism 100 is driven to transfer the brush supporting member 44 in parallel with one side of the substrate G. The scrubbing brush 41 is rotated and also traveled from one edge of the substrate G to the other edge, its traveling direction is reversed at the other edge, and the scrubbing brush 41 is returned to the starting position. Meanwhile, the inner cup 30b is raised by the up-and-down drive mechanism 33, and the ultrasonic washing apparatus 45 is on standby in the standby position 39b behind the inner cup 30b, so that the scattered washing liquid is prevented from adhering to the ultrasonic washing apparatus 45 while the brush scrubbing apparatus 40 is scrubbing the surface of the substrate G.

When the scrubbing brush 41 has returned to the one edge of the substrate G, the brush scrubbing apparatus 40 stops the brush rotating mechanism 43 to stop the rotation of the scrubbing brush 41, and also closes the valve 42d of the washing liquid feeding mechanism 42 to cut the supply of the washing liquid to the washing liquid injection nozzles 42c, thereby stopping the supply of the washing liquid to the scrubbing brush 41. This scrubbing operation may be repeated several times on the surface of the substrate G. Then, the up-and-down drive mechanism 140a is driven to raise the scrubbing brush 41 to move over the rising inner cup 30b and to reach the standby position 39a located behind the inner cup 30b. The ultrasonic washing apparatus 45 is moved over the inner cup 30b toward the substrate G by the up-and-down drive mechanism 140b and the nozzle drive mechanism 101. The substrate G is rotated at a predetermined speed by the motor 26. The washing liquid is injected from the spray nozzles 46a and the ultrasonic washing liquid injection nozzles 46b to wash the surface of the substrate G by a jet stream of water and ultrasonically oscillated washing water. The high-pressure washing liquid is injected to the substrate G as a jet stream of water from the spray nozzles 46a, and the washing liquid finely vibrating by ultrasonic waves is injected from the ultrasonic washing liquid injection nozzles 46b. The washing liquid is also injected from the nozzle formed on the base 32 to the back surface of the substrate G to wash it readily.

After washing the surface of the substrate G by injecting the washing liquid for a predetermined period, the valve 47d of the washing liquid feeding mechanism 47 is closed to stop supplying the washing liquid to the respective nozzles 46a, 46b. The ultrasonic washing apparatus 45 is raised to move over the inner cup 30b to the standby position 39b behind the inner cup 30b by the up-and-down drive mechanism 140b and the nozzle drive mechanism 101. Then, the number of revolutions of the substrate G is increased to a level for spin-drying of the substrate G.

After spin-drying the substrate G, the substrate G is stopped rotating, the lifter 28a is raised to give the substrate G to the main arm 4, which takes it out of the front surface scrubbing unit 2.

In this embodiment, as shown in FIGS. 1A and 1B, two of the front surface scrubbing unit 2 are disposed in parallel with each other to scrub the surfaces of two substrates G simultaneously. Since the back surface is scrubbed in about a half of the time required to scrub the front surface, the substrates G are alternately supplied from the back surface scrubbing unit 5 to the two front surface scrubbing unit 2, and the standby time of the back surface scrubbing unit 5 can be made short as small as possible.

Now, a second embodiment of the invention will be described.

Figure 12:
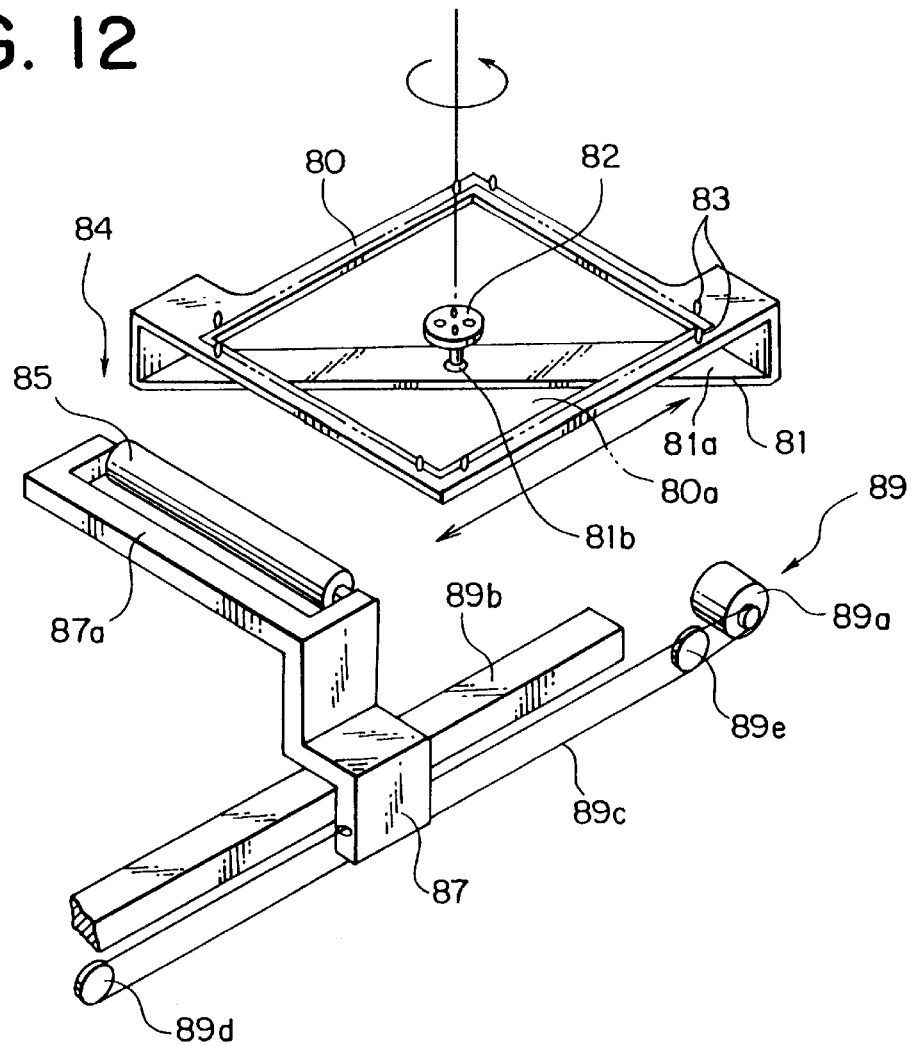
FIG. 12 is a perspective view illustrating the structure of main parts according to a second embodiment of the invention.

As shown in FIG. 12, a holding member 80 for holding the substrate G by its outer periphery from the back surface of the substrate G is formed, in the same manner as in the first embodiment, into a frame having an opening 80a which is slightly smaller than the substrate G and guide pins 83 at the same locations in the same number as in the first embodiment. The holding member 80 has its two opposite corners on a diagonal line supported by a U-shaped supporting member 81. The supporting member 81 is mounted on a freely rotatable shaft (not shown) with a through hole 81b formed at the center of its bottom 81a. A lifter 82 for catching the substrate G by vacuum-sucking it is inserted so to freely move up and down into a hollow hole of a hollow rotating shaft (not shown) and the through hole 81b.

An up-and-down drive mechanism for vertically moving the lifter 82 and a rotation drive mechanism for rotating the rotating shaft are configured in the same way as in the first embodiment and, therefore, their detailed descriptions will be omitted.

A brush scrubbing apparatus 84, which scrubs the back surface of the substrate G held by the holding member 80 by a rotating scrubbing brush 85, has the scrubbing brush 85 supported by a single cantilever arm 87a of a brush supporting member 87. The scrubbing brush 85 has the same width as that of the opening 80a of the holding member 80 as in the first embodiment to enable scrubbing of the entire back surface of the substrate G exposed toward the bottom through the opening 80a.

Figure 16:
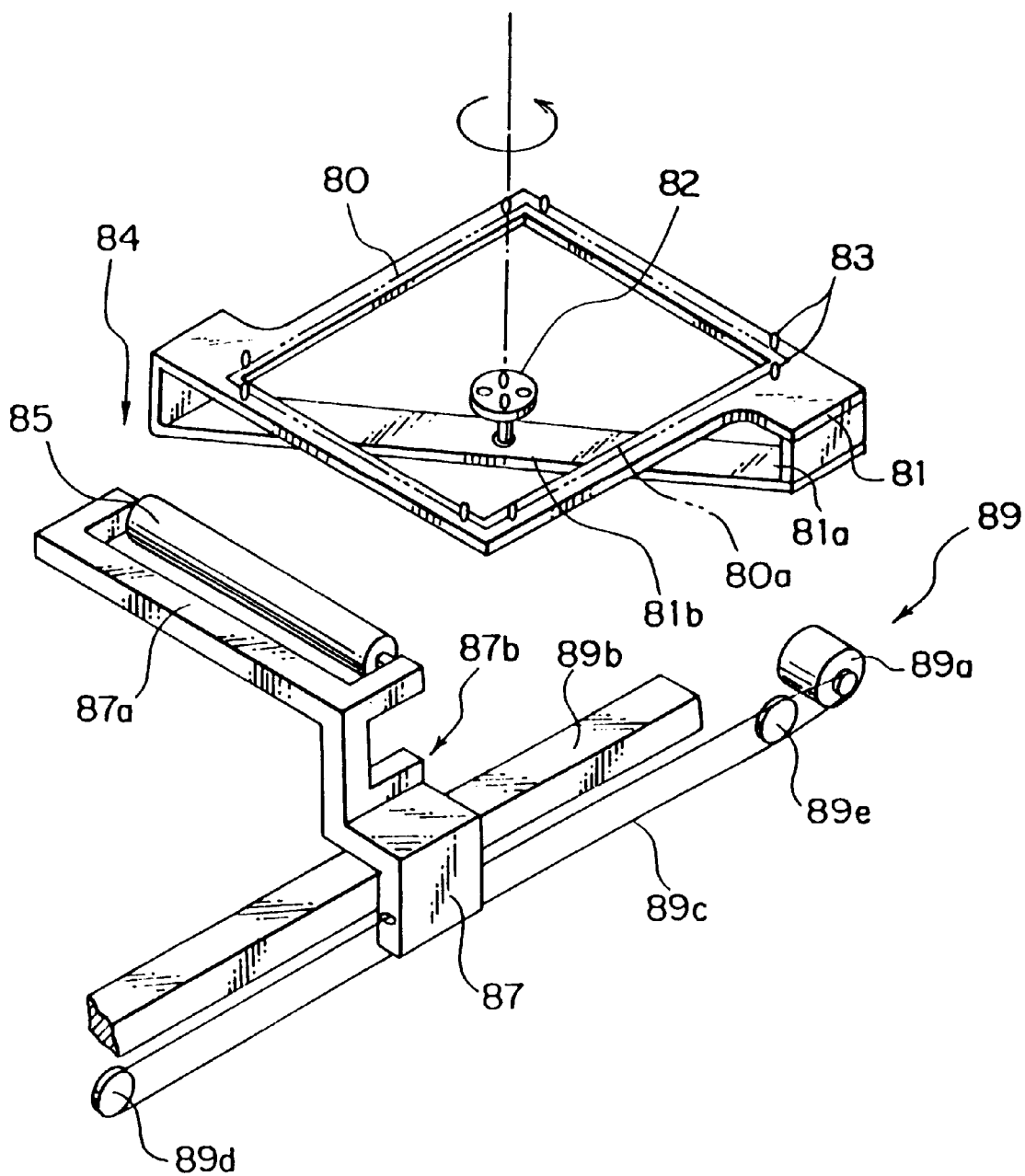
FIG. 16 is a perspective view showing a modification of the second embodiment of the invention.

The brush supporting member 87 supports the scrubbing brush 85 from below in this embodiment as shown in FIG. 12 but may have the same configuration as in the first embodiment. The arm 87a is thinner than a space between the holding member 80 and the bottom of the supporting member 81. Movement of the brush supporting member 87 from one end to the other end of the substrate G does not cause the interference between the arm 87a and the supporting member 81. Where an offset portion 87b is formed on the brush supporting member 87 as shown in FIG. 16, a supporter 81c of the supporting member 81 may be formed on the side of the brush supporting member 87. The mechanical chuck shown in FIG. 16 is configured symmetric with respect to a point, so that it rotates in a good dynamic balance. Accordingly, it can be rotated at a high speed, and its drying capacity can be improved. A brush drive mechanism 89, which moves back and forth the brush supporting member 87 in parallel with one side of the substrate G, essentially consists of a guide 89b which is disposed below the substrate G and in parallel with the above-described side of the substrate G, a motor 89a which is disposed at one end of the guide 89b, pulleys 89d, 89e which are disposed at both ends of the guide 89b, and a belt 89c which is passed around the motor 89a and the pulleys 89d, 89e. The belt 89c is engaged with the supporting member 87. Accordingly, when the motor 89a is activated, the belt 89c travels between the pulleys 89d, 89e, and the brush supporting member 87 engaged with the belt 89c is moved along the guide 89b.

The same washing liquid injection nozzles as in the first embodiment can be disposed in this embodiment to directly inject the washing liquid from the washing liquid injection nozzles to the scrubbing brush 85 or the back surface of the substrate G.

The back surface scrubbing apparatus of the second embodiment operates as follows.

The substrate G is held on the holding member 80 and its back surface is scrubbed by the scrubbing brush 85 which travels as the brush supporting member 87 moves. To scrub the substrate G, the washing liquid may be injected directly to the back surface of the substrate G or supplied to the scrubbing brush 85. The scrubbing brush 85 can be traveled without being interfered with the supporting member 81, so that the entire back surface of the substrate G can be scrubbed by a single stroke of the brush 85. Upon completion of scrubbing the back surface by the scrubbing brush 85, the rotation drive mechanism is driven to rotate the holding member 80 to dry the substrate G by spinning off the washing liquid.

Since the back surface scrubbing apparatus of this embodiment can scrub the back surface of the substrate G by simply transferring the scrubbing brush 85, the substrate G is not required to be moved horizontally and its back surface can be scrubbed in a very limited space. And, since the substrate G is dried by spinning the holding member 80, its drying can be made in the same space. Besides, the entire back surface of the substrate G can be scrubbed by a single stroke, so that the scrubbing time can be made short.

The first and second embodiments can have a gas injecting nozzle to blow a drying gas (air or inert gas such as nitrogen gas) to the back surface of the substrate G and scan or traverse the exposed back surface of the substrate G by the gas injecting nozzle. Thus, drying can be achieved in the same space, eliminating the necessity of the rotation derive mechanism for rotating the holding members 70, 80 to make the spin-drying.

Figure 13:
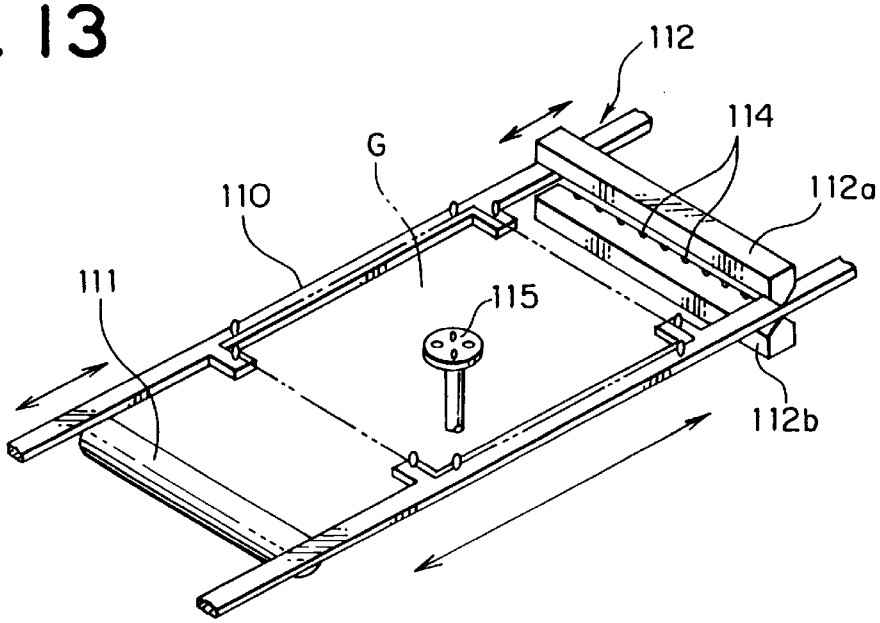
FIG. 13 is a perspective view illustrating the structure of main parts of a gas injection nozzle according to an embodiment of the invention.

FIG. 13 shows an example of the back surface scrubbing apparatus provided with a gas injection nozzle for blowing a drying gas (air or inert gas such as nitrogen gas) to the back surface of the substrate G.

A gas injection nozzle 112 for blowing a gas (air or an inert gas such as nitrogen gas) to the front and back surfaces of the substrate G is disposed to face a scrubbing brush 111 for scrubbing the back surface of the substrate G which is held by a frame-shaped holding member 110. This gas injection nozzle 112 is freely moved back and forth by a drive mechanism (not shown) in parallel with one side of the substrate G. This drive mechanism may be the same as the brush drive mechanism 89 of the second embodiment. Reference numeral 115 is a lifter which vacuum-sucks the substrate G to raise or lower it.

The gas injection nozzle 112 consists of a pair of nozzle bodies 112a, 112b which has substantially the same width as that of the substrate G and a gas flow hole therein and is disposed to oppose vertically to each other so to have the substrate G between them. The nozzle bodies 112a, 112b have their mutually opposed sides with the substrate G therebetween tapered as shown in FIG. 13 and a plurality of gas injection ports 114 formed at equal intervals along the longitudinal direction of the nozzle bodies 112a, 112b. A drying gas is supplied from a gas feeding mechanism (not shown) to the gas injection nozzle 112 and injected to the substrate G through the gas injection ports 114.

The nozzle bodies 112a, 112b of the gas injection nozzle 112 may be disposed on either the front or back surface of the substrate G. Specifically, if the back surface is to be scrubbed, only the nozzle body 112b may be disposed on the side of the back surface of the substrate G, and if the front surface is to be scrubbed, the nozzle body 112a may be disposed only on the side of the front surface of the substrate G.

After the back surface of the substrate G is scrubbed by the scrubbing brush 111, the gas injection nozzle 112 configured as described above is traveled in a direction parallel with one side of the substrate G to inject the drying gas to the substrate G to dry the front and back surfaces of the substrate G.

Now, a third embodiment of the invention will be described.

Figure 14:
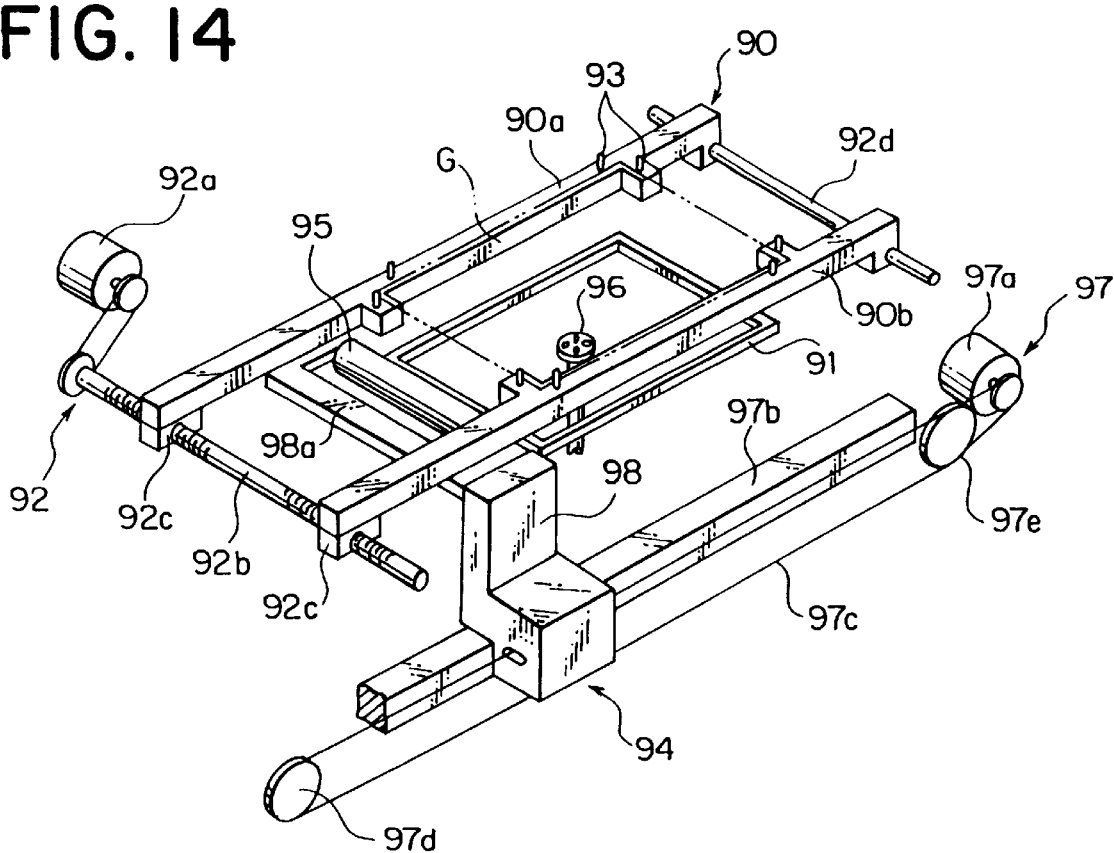
FIG. 14 is a perspective view illustrating the structure of main parts according to a third embodiment of the invention.

The holding member for holding the substrate G from its back in the third embodiment, as shown in FIG. 14, essentially consists of a first frame-shaped holding member 90 consisting of two frames 90a, 90b, and a second frame-shaped holding member 91 which is disposed below the first holding member 90 and holds the substrate G. The first holding member 90 has a separating drive mechanism 92 for moving the frames 90a, 90b to separate from each other. The separating drive mechanism 92 essentially consists of a motor 92a as the drive member, a ball screw 92b which has a reverse thread formed from its certain position to move nuts 92c, 92c, which are threaded on its both ends, in opposite directions by being rotated, and a guide 92d for guiding the frames 90a, 90b. The nuts 92c, 92c are fixed to the frames 90a, 90b, which are guided to move to mutually approach or separate by the guide 92d as the motor 92a is driven.

The second holding member 91, which is disposed on the top end of a rotating shaft (not shown), receives the substrate G which is freed from the released (separated) first holding member 90. And it is spun together with the substrate G by a rotation drive mechanism which drives to rotate the rotating shaft. A lifter 96 is disposed as a sending/receiving mechanism below the second holding member 91 to vacuum-suck the substrate G and lower the substrate G received from the main arm 4 (FIGS. 1A and 1B) to the first holding member 90 by driving an up-and-down drive mechanism (not shown), to lower the substrate G, which is freed by releasing the frames 90a, 90b of the first holding member 90, down to the second holding member 91, or to raise the substrate G, which has undergone the spin-drying by the second holding member 91, to a level to give the substrate G to the main arm 4.

The first holding member 90 and the second holding member 91 have guide pins 93 which are the same as those in the first and second embodiments and disposed at the same locations in the same quantity.

A brush scrubbing apparatus 94, which scrubs the back surface of the substrate G held by the holding member 90 by a rotating scrubbing brush 95, has the scrubbing brush 95 supported by a single cantilever arm 98*a* of a brush supporting member 98. The scrubbing brush 95 has the same width as that of the opening of the holding member 90 in the same manner as in the first and second embodiments to enable scrubbing of the entire back surface of the substrate G exposed toward the bottom through the opening.

The brush supporting member 98 may be the same supporting member as in the first embodiment. But, as seen in FIG. 14, it is configured in this embodiment to support the scrubbing brush 95 from below in the same way as in the second embodiment. A space between the first holding member 90 and the second holding member 91 is sufficient not to disturb the travel of the scrubbing brush 95. A brush drive mechanism 97, which moves the brush supporting member 98 back and forth in parallel with one side of the substrate G, mainly consists of a guide 97*b* disposed below the substrate G in parallel with one side of the substrate G, a motor 97*a* as a drive member disposed at one end of the guide 97*b*, pulleys 97*d*, 97*e* disposed at both ends of the guide 97*b*, and a belt 97*c* passed around the motor 97*a* and the pulleys 97*d*, 97*e*. The belt 97*c* is engaged with the brush supporting member 98. Accordingly, when the motor 97*a* is driven, the belt 97*c* runs between the pulleys 97*d*, 97*e*, and the brush supporting member 98 engaged with the belt 97*c* is traveled in a direction parallel with one side of the substrate G along the guide 97*b*.

The rotation drive mechanism, which rotates the second holding member 91 together with a rotating shaft (not shown), is configured in the same way as in the first and second embodiments, and its detailed description is omitted. The up-and-down drive mechanism for moving up and down the lifter 96 is also configured in the same way as in the first and second embodiments except that the lifter 96 can be moved up and down with its height changed stepwisely and, therefore, its detailed description is omitted.

In this embodiment, the first holding member 90 is supported by both ends of the frames 90*a*, 90*b* within the container. And, no supporting member is disposed on the path, where the scrubbing brush 95 moves back and forth, to support the first holding member 90, so that the entire back surface of the substrate G can be scrubbed by a single stroke of the brush 95.

In the third embodiment, the operation is performed as follows.

The back surface scrubbing apparatus of this embodiment holds the substrate G on the first holding member 90 and scrubs the back surface of the substrate G by the scrubbing brush 95 which is moved back and forth. The washing liquid may be injected directly to the back surface of the substrate G. The washing liquid may also be supplied to the scrubbing brush 95. Since the scrubbing brush 95 can be moved without being interfered with the supporting member, the entire back surface of the substrate G can be scrubbed by a single stroke of the brush 95. Upon completing the scrubbing of the back surface of the substrate G by the scrubbing brush 95, the separating drive mechanism 92 is driven to open the frames 90*a*, 90*b* to give the substrate G to the lifter 96. The lifter 96 is lowered by an up-and-down drive mechanism (not shown) to give the substrate G to the second holding member 91. The substrate G held by the second holding member 91 is spun together with the second holding member 91 by the rotating drive mechanism to make spin-drying.

Therefore, since the invention scrubs by the scrubbing brush 95 while transferring it, namely the substrate G is not required to be transferred while it is being scrubbed, the back surface of the substrate G can be scrubbed in a very limited space. And, the substrate G can be given to the second holding member 91 which is disposed below the first holding member 90, and the substrate G held by the second holding member 91 can be dried by spinning.

This embodiment can scrub the back surface of a subject substrate and dry it in a very limited space in the same way as in the first and second embodiments.

The third embodiment can also have a gas injection nozzle for injecting a drying gas (air or an inert gas such as nitrogen gas) as shown in FIG. 13 in the same way as in the first and second embodiments and scan the exposed back surface of the substrate G by the gas injecting nozzle to dry the substrate G. Since the substrate G is not required to be rotated to make spin-drying, the second holding member 91 is not required. Thus, the third embodiment can further save a space and can simplify the apparatus configuration.

Figure 15:
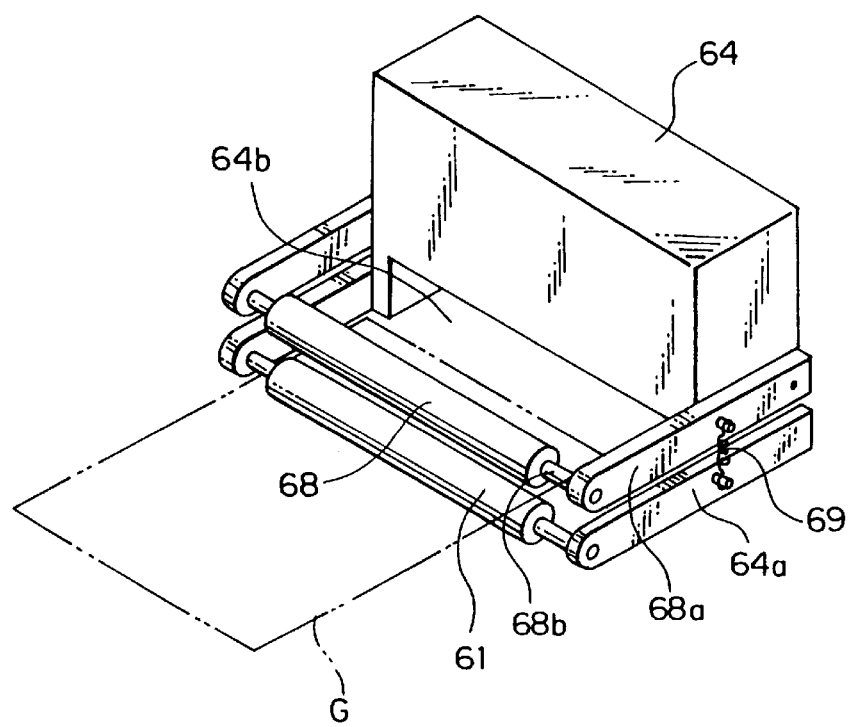
FIG. 15 is a perspective view illustrating the structure of main parts of a fourth embodiment having an additional scrubbing brush disposed to scrub the front surface of the substrate.

Now, a fourth embodiment of the invention will be described with reference to FIG. 15.

The brush scrubbing apparatus of this embodiment has substantially the same structure as that of the brush scrubbing apparatus 60 of the first embodiment. And, like reference numerals are used in this embodiment to designate like locations and parts of the first embodiment, and their detailed descriptions are omitted.

In addition to the scrubbing brush 61 for scrubbing the back surface of the substrate, this embodiment has another scrubbing brush 68 to prevent the scrubbing brush 61 from moving upward. The scrubbing brush 68 is disposed on the side of the front surface of the substrate G and rotated by a brush rotating mechanism (not shown) to scrub the front surface of the substrate G. The scrubbing brush 68 is fixed to a rotating shaft 68*b* which is rotatably supported by the leading ends of arms 68*a*, 68*a* mounted on a supporting member 64. The arms 68*a*, 68*a* are supported by the supporting member 64 to pivot freely and pushed downward by a pushing means such as a spring 69. A washing liquid injection nozzle (not shown) may be disposed to inject directly the washing liquid to the front surface scrubbing brush 68 or to the surface of the substrate G. A brush rotating mechanism for the back surface scrubbing brush 68 is the same as the brush rotating mechanism 63 for the back surface scrubbing brush 61, and its detailed description is omitted.

This embodiment can scrub the front and back surfaces of the substrate G simultaneously and prevent the substrate G being scrubbed from being moved upward by virtue of the front surface scrubbing brush 68. Thus, the front and back surfaces of the substrate G can be scrubbed uniformly. Specifically, the front surface scrubbing brush 68 is moved in synchronization with the back surface scrubbing brush 61 to serve as an anti-uprise member to hold the surface of the substrate G, thereby preventing the substrate G from being moved upward.

And, either of the scrubbing brushes 61, 68 is pivotably supported by the supporting member 64, and the scrubbing brushes 61, 68 are pushed against the substrate G by the pushing means. Thus, the scrubbing brushes 61, 68 are pushed against the substrate G by an appropriate force to scrub both surfaces of the substrate G. Use of a roller brush as the scrubbing brush can increase the simultaneously scrubbing areas, decrease an uprising level of the substrate, and make the scrubbing space flat and compact.

The scrubbing apparatus of the invention travels the scrubbing brush to scrub the substrate, namely the substrate is not required to be moved when it is scrubbed, so that the back surface of the substrate can be scrubbed in a very limited space. Besides, the holding member is rotated to spin-dry the substrate. Thus, drying can be achieved in the same space. In other words, the scrubbing apparatus of the invention can scrub the back surface of the substrate and dry it in a very limited space.

Besides, the scrubbing time can be shortened because the entire back surface of the substrate can be scrubbed by a single stroke.

Since the drying gas is injected through the gas injection nozzle to dry the substrate, the drying treatment can be made in the same space. In other words, the scrubbing apparatus of the invention can achieve the scrubbing of the back surface of the substrate and its drying in a very limited space. Furthermore, since the invention has the gas injection nozzle to dry the substrate, a mechanism to rotate the holding member is eliminated, and the configuration can be simplified.

The substrate is transferred to the second holding member disposed below the first holding member and spin-dried by rotating the second holding member. Thus, drying can be done in one and the same area.

Using a roller brush as the scrubbing brush allows to expand the simultaneously scrubbing region and also to decrease an uprise level of the substrate. And, the scrubbing space can be made more low and compact.

Since the uprise-preventing member prevents the substrate being scrubbed from moving upward, scrubbing can be made uniformly, and a mechanical adverse effect on the substrate can be eliminated.

Since the front and back surfaces of the substrate can be scrubbed simultaneously, scrubbing can be performed more efficiently.

In addition, since the substrate being scrubbed can be prevented from moving upward, its front and back surfaces can be scrubbed uniformly, and a mechanical adverse effect on the substrate can be eliminated.

For example, when the substrate is transferred to or from the holding member or when the holding member is rotated, an impact of the substrate due to contacting with the guide pins can be eased, and the substrate can be prevented from having a crack. And, the surface of the elastic member is covered by a rigid member to prevent the elastic member from being abraded quickly.

What is claimed is:

1. A scrubbing apparatus for scrubbing the back surface of a substrate to be scrubbed, comprising:
   a first supporting member, which supports the substrate from the back surface thereof and has an opening to expose the back surface of the substrate downwards;
   a scrubbing brush, which comes in contact with the exposed back surface of the substrate from the bottom side of the first supporting member;
   a brush transferring mechanism, which transfers the scrubbing brush along the back surface of the substrate;
   a second supporting member, which supports the first supporting member at a position thereof such that the transferred scrubbing brush avoids contacting the second supporting member; and
   a rotation drive mechanism, which drives to rotate the first supporting member together with the second supporting member.

2. The scrubbing apparatus as set forth in claim 1, wherein the position of the first supporting member is substantially at a center of two opposed sides of the first supporting member.

3. The scrubbing apparatus as set forth in claim 2, wherein the first supporting member has a plurality of guide pins along an edge of the supported substrate to prevent the substrate from moving horizontally, and the guide pins have guide pin bodies covered by an elastic member, which is further covered by a rigid member.

4. The scrubbing apparatus as set forth in claim 2, further comprising a means for forming a film of water on the surface of the substrate which is supported by the first supporting member.

5. The scrubbing apparatus as set forth in claim 4, wherein the forming means is a spray for spraying water, which is disposed to oppose the scrubbing brush and is transferred in synchronization with the scrubbing brush.

6. The scrubbing apparatus as set forth in claim 2, further comprising a means for spraying a washing liquid to the back surface of the substrate which is supported by the first supporting member.

7. The scrubbing apparatus as set forth in claim 2, further comprising a means for supplying a washing liquid to the scrubbing brush.

8. The scrubbing apparatus as set forth in claim 2, further comprising:
   a means for controlling scrubbing substantially a half of the back surface of the substrate by the scrubbing brush, rotating the first supporting member by about 180 degrees by the rotation drive mechanism, scrubbing the remaining half of the back surface of the substrate by the scrubbing brush, and rotating the first supporting member by the rotation drive mechanism to spin-dry the substrate.

9. The scrubbing apparatus as set forth in claim 2, further comprising:
   an uprise preventing member, which is disposed to oppose the scrubbing brush with the substrate supported by the first supporting member positioned between them, the uprise preventing member being transferred in synchronization with the scrubbing brush to hold down the substrate.

10. The scrubbing apparatus as set forth in claim 2, further comprising:
    a front surface scrubbing brush, which is disposed to oppose the scrubbing brush with the substrate supported by the first supporting member positioned between them, the front surface scrubbing brush being transferred in synchronization with the scrubbing brush to scrub the back surface of the substrate.

11. A scrubbing apparatus as set forth in claim 1, wherein the second supporting member supports the first supporting member at each diagonal position of the first supporting member.

12. A scrubbing apparatus as set forth in claim 11, further comprising:
    a means for controlling scrubbing the entire back surface of the substrate by a single stroke of the scrubbing brush and rotating the first supporting member by the rotation drive mechanism to spin-dry the substrate.

13. A scrubbing apparatus for scrubbing a back surface of a substrate to be scrubbed, comprising:
    a holding member, which holds an outer circumference of the substrate from the back surface thereof and has an opening to expose the back surface of the held substrate toward a bottom side of the holding member;

a scrubbing brush, which comes in contact with the exposed back surface of the substrate from the bottom side of the holding member;

a brush transferring mechanism, which transfers the scrubbing brush along the exposed back surface of the substrate;

a first gas injection nozzle, which injects a drying gas to the exposed back surface of the substrate from the bottom side of the holding member; and a nozzle transferring mechanism, which moves the gas injection nozzle to scan or traverse the exposed back surface of the substrate.

14. The scrubbing apparatus as set forth in claim 13, further comprising a second gas injection nozzle, which scans, in synchronization with the first gas injection nozzle, to inject the drying gas to a front surface of the substrate.

15. The scrubbing apparatus as set forth in claim 2, wherein the scrubbing brush is a roller brush, which is driven to rotate by a roller rotating mechanism.

* * * * *

UNITED STATES PATENT AND TRADEMARK OFFICE
CERTIFICATE OF CORRECTION

PATENT NO. : 6,058,544
DATED : May 9, 2000
INVENTOR(S) : MOTODA et al.

It is certified that error appears in the above-identified patent and that said Letters Patent is hereby corrected as shown below:

Column 10, line 33, change "61a" to - -61b- -.

Column 12, line 22, after "member" insert - -73b- -.

Column 15, line 54, change "derive" to - - drive- -.

Signed and Sealed this

Eighth Day of May, 2001

Attest:

NICHOLAS P. GODICI

Attesting Officer

Acting Director of the United States Patent and Trademark Office